United States Patent
An

(10) Patent No.: US 12,107,194 B2
(45) Date of Patent: Oct. 1, 2024

(54) SEMICONDUCTOR LIGHT-EMITTING DEVICE

(71) Applicant: WAVELORD CO., LTD., Gyeonggi-do (KR)

(72) Inventor: Sang Jeong An, Incheon (KR)

(73) Assignee: WAVELORD CO., LTD., Gyeonggi-do (KR)

( * ) Notice: Subject to any disclaimer, the term of this patent is extended or adjusted under 35 U.S.C. 154(b) by 618 days.

(21) Appl. No.: 17/417,904

(22) PCT Filed: Dec. 27, 2019

(86) PCT No.: PCT/KR2019/018608
§ 371 (c)(1),
(2) Date: Aug. 11, 2021

(87) PCT Pub. No.: WO2020/139022
PCT Pub. Date: Jul. 2, 2020

(65) Prior Publication Data
US 2022/0093829 A1 Mar. 24, 2022

(30) Foreign Application Priority Data

Dec. 27, 2018 (KR) .................. 10-2018-0170282
Apr. 3, 2019 (KR) .................. 10-2019-0039129
(Continued)

(51) Int. Cl.
*H01L 33/48* (2010.01)
*H01L 33/60* (2010.01)
(Continued)

(52) U.S. Cl.
CPC ............ *H01L 33/486* (2013.01); *H01L 33/60* (2013.01); *H01L 33/62* (2013.01); *H01L 33/647* (2013.01); *H01L 33/641* (2013.01)

(58) Field of Classification Search
CPC ........ H01L 33/644; H01L 33/60; H01L 33/64
See application file for complete search history.

(56) References Cited

U.S. PATENT DOCUMENTS

| 8,026,610 B2 | 9/2011 | Murayama |
| 8,044,429 B2 | 10/2011 | Higashi et al. |

(Continued)

FOREIGN PATENT DOCUMENTS

| JP | 2009-277895 A | 11/2009 |
| JP | 2013-143430 A | 7/2013 |

(Continued)

OTHER PUBLICATIONS

International Search Report from corresponding PCT Application No. PCT/KR2019/018608, dated Apr. 28, 2020.

*Primary Examiner* — Yu-Hsi D Sun
(74) *Attorney, Agent, or Firm* — Harness, Dickey & Pierce, P.L.C.

(57) ABSTRACT

Disclosed is a semiconductor light emitting device comprising a semiconductor light emitting chip having electrodes; a mold, which has a first surface roughness and includes a bottom portion where the semiconductor light emitting chip is arranged and through holes formed in the bottom portion, with the through holes being comprised of a surface having a second surface roughness different from the first surface roughness, wherein at least one side of the mold facing the semiconductor light emitting chip is made of a material capable of reflecting at least 95% of light emitted by the semiconductor light emitting chip; and conductive parts provided in the through holes for electrical communication with the electrodes.

14 Claims, 16 Drawing Sheets

(30)   Foreign Application Priority Data

| | | |
|---|---|---|
| May 10, 2019 | (KR) | 10-2019-0054910 |
| Jul. 1, 2019 | (KR) | 10-2019-0078997 |
| Aug. 9, 2019 | (KR) | 10-2019-0097291 |

(51) Int. Cl.
  *H01L 33/62* (2010.01)
  *H01L 33/64* (2010.01)

(56)   References Cited

U.S. PATENT DOCUMENTS

| | | |
|---|---|---|
| 2006/0001055 A1 | 1/2006 | Ueno et al. |
| 2006/0198162 A1 | 9/2006 | Ishidu et al. |
| 2007/0187706 A1* | 8/2007 | Higashi .................. H01L 33/60 257/E33.072 |
| 2012/0132947 A1 | 5/2012 | Krauter |
| 2014/0147682 A1 | 5/2014 | Takano et al. |
| 2015/0188011 A1 | 7/2015 | Kang |
| 2015/0235996 A1 | 8/2015 | Kobayakawa et al. |
| 2016/0190418 A1 | 6/2016 | Inomata et al. |

FOREIGN PATENT DOCUMENTS

| | | |
|---|---|---|
| KR | 10-2007-0082538 A | 8/2007 |
| KR | 10-1358215 B1 | 2/2014 |
| KR | 10-2015-0078295 A | 7/2015 |
| KR | 10-2015-0095382 A | 8/2015 |

* cited by examiner

SEMICONDUCTOR LIGHT-EMITTING DEVICE

CROSS-REFERENCE TO RELATED APPLICATIONS

This application is a national phase application of PCT Application No. PCT/KR2019/018608, filed on Dec. 27, 2019, which claims the benefit and priority to Korean Patent Application Nos. 10-2018-0170282, filed Dec. 27, 2018, 10-2019-0039129, filed on Apr. 3, 2019, 10-2019-0054910, filed on May 10, 2019, 10-2019-0078997, filed on Jul. 1, 2019, and 10-2019-0097291, filed on Aug. 9, 2019. The entire disclosures of the applications identified in this paragraph are incorporated herein by references.

TECHNICAL FIELD

The present disclosure relates generally to a semiconductor light emitting device, and more particularly to a semiconductor UV light emitting device.

BACKGROUND

This section provides background information related to the present disclosure which is not necessarily prior art.

FIG. 1 illustrates an exemplary embodiment of a semiconductor light emitting device disclosed in U.S. Pat. No. 9,773,950. In particular, it presents a CSP (Chip-Scaled Package) semiconductor light emitting device. The CSP semiconductor light emitting device includes a semiconductor light emitting chip 2, an encapsulating member 4, and a reflector 6 (e.g., a white photo solder resist (PSR)). The semiconductor light emitting chip 2 includes electrodes 80 and 90. The encapsulating member 4 has slanted sides 4b to adjust an emission angle of light from the semiconductor light emitting chip 2. The reflector 6 may be obtained by screen printing or spin coating a white PSR, followed by patterning with a typical photolithography process. If required for external electrical connection, external electrodes 81 and 91 may be provided through a deposition process.

FIG. 2 illustrates an exemplary embodiment of a semiconductor light emitting device disclosed in U.S. Pat. No. 10,008,648. In particular, it presents a semiconductor light emitting device 200 employing a pre-formed, rigid frame or mold 210 (e.g., injection molded frame) in order to maintain the positioning accuracy of a semiconductor light emitting chip 2 through a series of processes, which otherwise could be deteriorated due to the reflector 6 (e.g., the white PSR) of FIG. 1 made of flexible materials. As shown in FIG. 2, the semiconductor light emitting device 200 is provided with a mold 210, a semiconductor light emitting chip 220, and an encapsulating member 230. Other parts of the device 200 shown in the drawing include side walls 211, a bottom portion 212, a hole 213, a cavity 214, an upper face 215 of the bottom portion 212, a lower face 216 of the bottom portion 212, outer faces 217 of the side walls 212, inner faces 218 of the side walls 211, an electrode 221, a light converting material (phosphor) 231, and side walls 240 of the hole 213, with the bottom portion 212 having a height 219, the side walls 211 having a height H, and the semiconductor light emitting chip 220 having a height 222. This semiconductor light emitting device 200 is similar to a surface-mounted device (SMD) type semiconductor light emitting device (see U.S. Pat. No. 6,066,861) in that it has a mold 210, the absence of a lead frame or lead electrode, however, resolves the above-mentioned issue of the semiconductor light emitting device in FIG. 1, and also prevents any problem that involves bonding with an external substrate (e.g., cracks).

FIG. 3 illustrates an exemplary embodiment of a semiconductor light emitting device disclosed in Korean Patent Application Laid-Open No. 10-2018-0131303. The semiconductor light emitting device is also free from the issue associated with the reflector 6 of FIG. 1 and includes a mold 113 and a semiconductor light emitting chip 123. The mold 113 has conductive parts TH1 and TH2 made of a conductive paste or soldering materials. Other parts of the device shown in the drawing include a cavity C, electrodes 121 and 122, and an external substrate 131 (e.g., a PCB or a sub-mount). This semiconductor light emitting device is similar to the one shown in FIG. 2 in that it does not have a lead frame or lead electrode, the conductive parts TH1 and TH2, however, are involved in physical and electrical junction between the external substrate 131 and the semiconductor light emitting chip 123 and may even be separated from the mold 113 due to poor connection if the physical bonding strength gets weaker during the SMT process, as discussed in FIG. 2. On one hand, the semiconductor light emitting device illustrated in FIG. 2 is built without a lead frame or lead electrode such that it can suitably prevent light absorption by the lead frame or lead electrode. On the other hand, the semiconductor light emitting device illustrated in FIG. 3 is adapted to practically block light leaks downward of the mold 113 and to allow all the light generated by the semiconductor light emitting chip 123 to be emitted upward.

To summarize how an LED package has been developed or evolved, a lateral chip had first been wire-bonded to an SMD-type package, and a flip chip was then introduced to satisfy the demand for a high-power and high-voltage device. Later, it turned out that the flip chip was also inadequate for the SMD-type package, encouraging the use of a CSP-type package as shown in FIG. 1. As discussed earlier, however, this also imposed some challenges in adjustment of a beam angle and issues in a manufacturing process. Nowadays, a leadless frame or mold-type LED package without a lead frame or lead electrode, as shown in FIGS. 2 and 3, is being used. However, in case of the semiconductor light emitting device in FIG. 3, holes are formed in the mold 113 (e.g., injection mold) for the conductive parts TH1 and TH2, respectively. These injection molded holes have a smooth surface corresponding to the surface roughness of the mold. Therefore, the physical bonding strength between the mold and the conductive parts TH1 and TH2 (prepared by deposition or plating) may not be high enough to hold them together.

Objectives, advantages, and a preferred mode of making and using the claimed subject matter may be understood best by reference to the accompanying drawings in conjunction with the following detailed description of illustrative embodiments.

SUMMARY

This section provides a general summary of the disclosure and is not a comprehensive disclosure of its full scope or all of its features.

According to one aspect of the present disclosure, there is provided a semiconductor light emitting device, comprising: a semiconductor light emitting chip having electrodes; a mold, which has a first surface roughness and includes a bottom portion where the semiconductor light emitting chip is arranged and through holes formed in the bottom portion, with the through holes being comprised of a surface having a second surface roughness different from the first surface roughness, wherein at least one side of the mold facing the semiconductor light emitting chip is made of a material capable of reflecting at least 95% of light emitted by the semiconductor light emitting chip; and conductive parts provided in the through holes for electrical communication with the electrodes.

According to another aspect of the present disclosure, there is provided a method for manufacturing a semiconductor light emitting device including a semiconductor light emitting chip having electrodes, a mold which has a bottom portion where the semiconductor light emitting chip is arranged and through holes formed in the bottom portion, and conductive parts provided in the through holes for electrical communication with the electrodes, the method comprising: preparing a lead frame which has one or more molds and an anti-plating layer formed on a region exposed from the molds; forming conductive parts in each of the molds and electrically communicating the conductive parts with the electrodes of the semiconductor light emitting chip; and cutting out the lead frame to obtain individual semiconductor light emitting devices.

According to another aspect of the present disclosure, there is provided a semiconductor light emitting device, comprising: a semiconductor UV light emitting chip having electrodes; a bottom portion where the semiconductor light emitting chip is arranged, with the bottom portion being made of a ceramic material and including conductive parts for electrical communication with the electrodes; and a reflective wall defining a cavity to accommodate the semiconductor light emitting chip therein, with the reflective wall being made of a non-metal and including a slanted side that reflects UV light and a metal reflective layer formed on the slanted side.

According to another aspect of the present disclosure, there is provided a semiconductor light emitting device adapted to be coupled to a power supply board by a solder, comprising: a semiconductor light emitting chip having electrodes; a mold, which includes a bottom portion where the semiconductor light emitting chip is arranged and through holes having a surface roughness higher than that of an upper side of the bottom portion; hollow conductive parts provided in the through holes for electrical communication with the electrodes; and an air gap-preventing material provided in each of the through holes for preventing the creation of air gaps as the solder enters into the through holes along the conductive parts.

Objectives, advantages, and a preferred mode of making and using the claimed subject matter may be understood best by reference to the accompanying drawings in conjunction with the following detailed description of illustrative embodiments.

DETAILED DESCRIPTION

Figure 1:
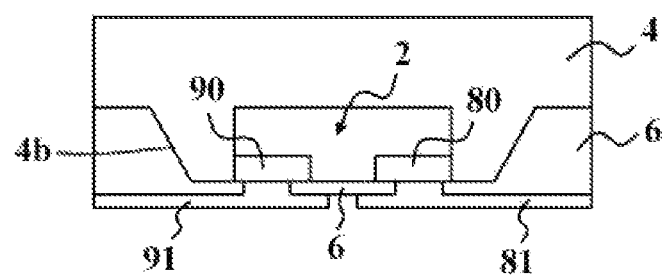
FIG. 1 illustrates an exemplary embodiment of a semiconductor light emitting device disclosed in U.S. Pat. No. 9,773,950.
Figure 2:
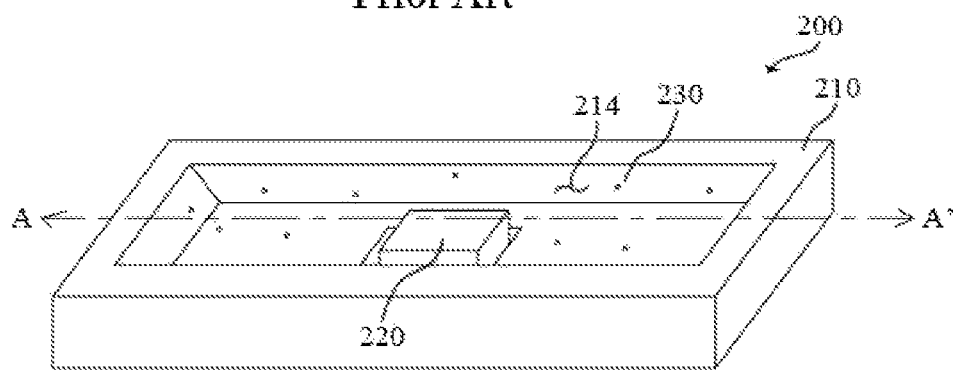
FIG. 2 illustrates an exemplary embodiment of a semiconductor light emitting device disclosed in U.S. Pat. No. 10,008,648.
Figure 2:
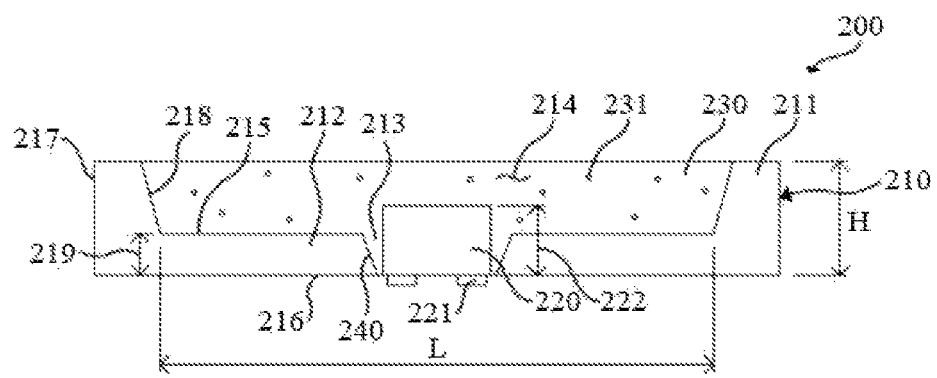

One of the features of the present disclosure is a through hole formed at the bottom portion of a mold for a semiconductor light emitting device that has a higher roughness on the inner surface of the hole to improve bonding strength between the mold and an electroless plated conductive material. The through hole is either laser drilled or preformed during injection molding. Although the thickness of the bottom portion of the mold is not particularly limited, it preferably ranges from 100 to 500 μm. For example, the thickness is preferably 100 μm or more such that the light generated by a semiconductor light emitting chip may not be transmitted downward and a sufficiently large area of the mold is bonded with the electroless plated conductive material. In addition, the thickness is preferably 500 μm or lower to make laser drilling possible. Needless to say, if the mold has a very thick bottom portion, laser irradiation will have to be carried out multiple times.

A second feature of the present disclosure is a material of the mold that contains laser direct structuring (LDS) additives in addition to thermoplastics or thermosetting plastics. In application of the LDS process, the surface of an injection molded article made of a molding resin is subjected to laser irradiation, followed by electroless plating. The former results in a rougher and electrically activated surface, and the latter allows the formation of a conductive material thereon. Examples of a molding resin typically used for a semiconductor light emitting device include thermoplastics such as polyphthalamide (PPA) or polycyclohexylene dimethylene terephthalate (PCT)), and thermosetting plastics such as epoxy mold compounds (EMC) or silicone molding compounds (SMC). When blue or green light emitting chips are used, the molding resin is added with a filler or a light scattering agent to increase the reflectance, including, for example, but without limitation, a white pigment $TiO_2$ (titania), $SiO_2$ (silica) and/or $Al_2O_3$ (alumina). In addition to the PPA and PCT mentioned above, other thermoplastics may also be used for a light emitting device, including, for example, but without limitation, polyamides (PA), polycarbonate (PC), polyphthalamide (PPA), polyphenylene oxide (PPO), polybutylene terephthalate (PBT), cycloolefin polymers (COP), liquid-crystal polymers (LCP), copolymers or blends thereof, such as acrylonitrile-butadiene-styrene/polycarbonate blend (PC/ABS), PBT/PET, and the like. Likewise, in addition to the EMC and SMC mentioned above, other thermosetting plastics may also be used for a light emitting device, including, for example, but without limitation, polyurethanes, melamine resins, phenolic resins, polyesters, and epoxy resins. However, successful implementation of a leadless frame or a mold-type LED package including a flip-chip type semiconductor LED chip is achieved by the LDS process, forming an electrical conductor circuit pattern (conductive material) with a strong physical bonding strength on the surface of the injection molded article made of a molding resin. In general, LDS technology is widely known and has been in the spotlight in the fast-growing mobile phone industry for its capability of direct implementation of an electrical conductor circuit pattern (conductive material) that serves as an antenna, onto the surface of a 2D and/or 3D injection molded article made of a molding resin. Its illustration can be found in an article titled "Selective Metallization Induced by Laser Activation: Fabricating Metallized Patterns on Polymer via Metal Oxide Composite", ACS Appl. Mater. Interfaces 2017, Volume 9, Pages 8996-9005. As described in this article, 5 wt. % of $CuO \cdot Cr_2O_3$ (Cu—Cr oxide composite) is blended with an ABS polymer matrix and the resulting mixture is injection molded. When a 1064 nm laser beam is irradiated onto the surface of the injection molded article, $CuO \cdot Cr_2O_3$ is decomposed and a significant amount of electrically activated metallic Cu radicals are formed on a roughened surface, and the radials serve as seeds in the subsequent electroless plating process. In particular, it is possible to form micro electric path lines having a 100-micron (μm) resolution by optimizing certain parameters of the laser beam being irradiated (i.e., wavelength=1064 nm, power output=8 W, irradiation speed=2000 mm/s). The plating process can be carried out on the surface of the injection molded article made of a molding resin because the molding resin is ablated by laser irradiation, resulting in a roughened surface, and the LDS additives anchored in the surface are then electrically activated and serve as seeds for forming an electroless plated layer. Among others, the LDS additives serving as seeds in the molding resin (e.g., the thermosetting plastic or thermoplastic) by the irradiated laser beam during the LDS process is referred to as a first additive. Additionally, or alternatively, other functional additives may be mixed with the first additive to meet the requirements of a device in terms of improving heat dissipation or increasing the optical reflectance, for example. In general, the first additive may include at least one of: Pd-based heavy metal complexes and metal oxides, metal oxide-coated fillers, $CuO \cdot Cr_2O_3$ spinel, copper salts, copper hydroxyphosphate, copper phosphate, cuprous thiocyanate, spinel-based metal oxides, $CuO \cdot Cr_2O_3$, organometallic complexes, antimony (Sb) doped Sn oxide, or metal oxides containing Cu, Zn, Sn, Mg, Al, Au, Ag, Ni, Cr, Fe, V, Co, or Mn. To improve heat dissipation performance, a second additive may be added as another functional additive. The second additive may include at least one of: AlN, AlC, $Al_2O_3$, AlON, BN, $MgSiN_2$, $Si_3N_4$, SiC, graphite, graphene, carbon fiber, ZnO, CaO, or MgO. To improve the optical reflectance, a third additive may be added as another functional additive. The third additive may include at least one of: $TiO_2$, ZnO, BaS, or $CaCO_3$. The type of molding resins and LDS additives used and mixing ratios thereof may vary depending on the usage of an applied current to a semiconductor light emitting device. Since the first additive used as a primary component for the LDS process and the second additive used for improving heat dissipation are typically not involved in light reflection, they are used to a very limited extent (e.g., 10 wt. % or less). This can be different whether the additives are used for semiconductor light emitting devices or for general MIDs (Mold Interconnect Devices). Again, the type of molding resins and LDS additives and mixing ratios thereof may vary depending on the usage of an applied current to a semiconductor light emitting device. As an alternative, the mold can be injection molded in the form of a single part or separated parts, in which an amount of the first and second additives used in the bottom portion of the mold may be relatively larger than an amount of the first and second additives used in the other portions of the mold. If the LDS additives (the first, second and third additives) are used to a very limited extent, certain parameters of the laser beam being irradiated (e.g., wavelength, power output, and irradiation speed) may be modified according to the type of the LDS additives such that desired performance can be achieved. For example, although fiber laser (e.g., a 1064 nm wavelength laser beam for marking the plastic laser surface) is generally used during the LDS process, a laser beam having a UV wavelength band (400 nm or less) may have to be irradiated for a lengthier amount of time if a higher energy source is needed to decompose and activate the additives, such as, AlN (the second additive) and $TiO_2$ (the third additive). For instance, the third additive $TiO_2$ is present in the molding resin in an amount of at least 50 wt. % such that the molding resin may reflect at least 95% of the light generated by the semiconductor light emitting chip. During the injection molding, a laser beam with an appropriate wavelength (308 nm xenon chloride excimer laser) and power output or a laser beam used for drilling is irradiated onto the mold having a pre-formed through hole, and $TiO_2$ is decomposed to metal Ti radicals+ionic $TiO_x$ radicals+½ $O_2$ gas, which are then electrically activated (Ti and $TiO_x$), serving as seeds for the subsequent electroless plating.

A third feature of the present disclosure is an additional metal treatment applied to a lower surface of the bottom portion of the mold for better heat dissipation and increased physical bonding strength with an external substrate. That is, the electroless plating layer formed in the through hole is electrically connected to a metal to provide an electrical connection with the external substrate. If needed for an electrical connection to a semiconductor light emitting chip, this metal treatment may also be applied to an upper surface of the bottom portion of the mold, electrically connecting a metal to the electroless plating layer formed in the through hole.

The present disclosure will now be described in detail with reference to the accompanying drawing(s).

Figure 4A:
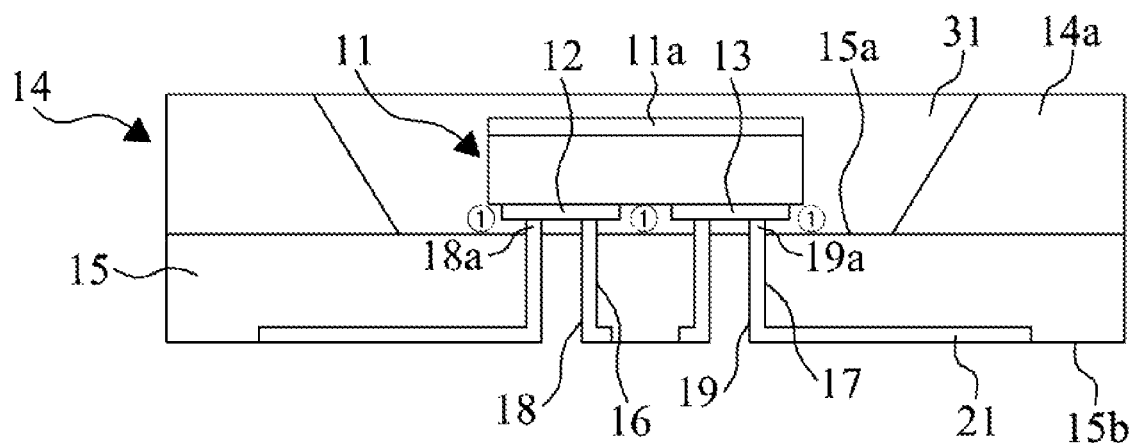
FIG. 4 illustrates an exemplary embodiment of a semiconductor light emitting device according to the present disclosure.

FIG. 4 illustrates an exemplary embodiment of a semiconductor light emitting device according to the present disclosure. As shown in FIG. 4A, the semiconductor light emitting device includes a semiconductor light emitting chip 11 and a mold 14. The semiconductor light emitting chip 11 is surrounded with an encapsulating member 31 that contains a light converting material such as a phosphor. The semiconductor light emitting chip 11 has electrodes 12 and 13. If a flip chip is used, a growth substrate 11a may be provided on opposite sides of the electrodes 12 and 13. This growth substrate 11a may be removed later. In general, the mold 14 has a bottom portion 15 where the semiconductor light emitting chip 11 is arranged, and a reflective wall 14a for adjustment of a beam angle. The mold 14 is usually pre-formed (e.g., injection molded), and its surface has a roughness determined by the mold. The bottom portion 15 has an upper side 15a and a lower side 15b, and through holes 16 and 17 are formed, passing through the upper side 15a and the lower side 15b. While the through holes 16 and 17 are preferably pre-formed by the mold, they can also be formed by laser drilling. The mold 14 is prepared by blending ingredients, including, for example, a resin (e.g., PPA, PCT, EMC, or SMC) and a white, light-reflecting filler (e.g., the third additive $TiO_2$) in a mixing ratio that allows the mold 14 to reflect at least 95% of the light generated by the semiconductor light emitting chip 11 to reduce light absorption. Additionally, or alternatively, instead of having the entire mold 14 made of the material described above, only those sides facing the semiconductor light emitting chip 11 may be coated with the material (see FIG. 9). The through holes 16 and 17 have conductive parts 18 and 19, respectively. The through holes 16 and 17 have a roughened surface so that the conductive parts 18 and 19 can be anchored thereon. The term "roughened" used herein means that the surface of the through holes 16 and 17 is processed, e.g., ablated by laser beam irradiation or laser drilling, so that the conductive parts 18 and 19 can be anchored thereon. If the through holes 16 and 17 are formed together with the mold 14, the through holes 16 and 17 and the mold 14 would have the same surface roughness. If the mold 14 contains metals and the first, second and/or third LDS additives ($TiO_2$, $CuO$, $Cu_2O$, $NiO$, $Cr_2O_3$, $PdO$, $Al_2O_3$) composed of non-conductive materials having ionic radicals, the metals are activated once the pre-formed or laser drilled through holes 16 and 17 in the mold 14 are exposed to the laser beam and serve as seeds for forming the conductive parts. In this case, the conductive parts can be formed without a separate patterning process, but by electroless plating only in the region activated by the laser. Additionally, a heat dissipation metal layer 21 may be formed by irradiating the laser beam onto the lower side 15b of the bottom portion and activating the metal contained therein. Preferably, the heat dissipation metal layer 21 is connected to the conductive parts 18 and 19. Similarly, forming the heat dissipation layer 21 by electroless plating makes it easier to form the heat dissipation layer 21 following a pattern of laser beam irradiation, that is, based on the designed pattern. For instance, the mold 14 may be prepared by blending 3 wt. % of $CuO·Al_2O_3$ or $CuAl_2O_4$ with a PCT polymer matrix, and the resulting blend is subjected to injection molding. Next, through holes 16 and 17 having a diameter of 300 microns and a depth of 250 microns are formed in the mold. Additionally, or alternatively, after the laser beam is irradiated, a process of removing residues can be carried out. In this manner, Cu (10 μm)/Ni (1 μm)/Au (0.02 μm) are sequentially formed by electroless plating.

Figure 3:
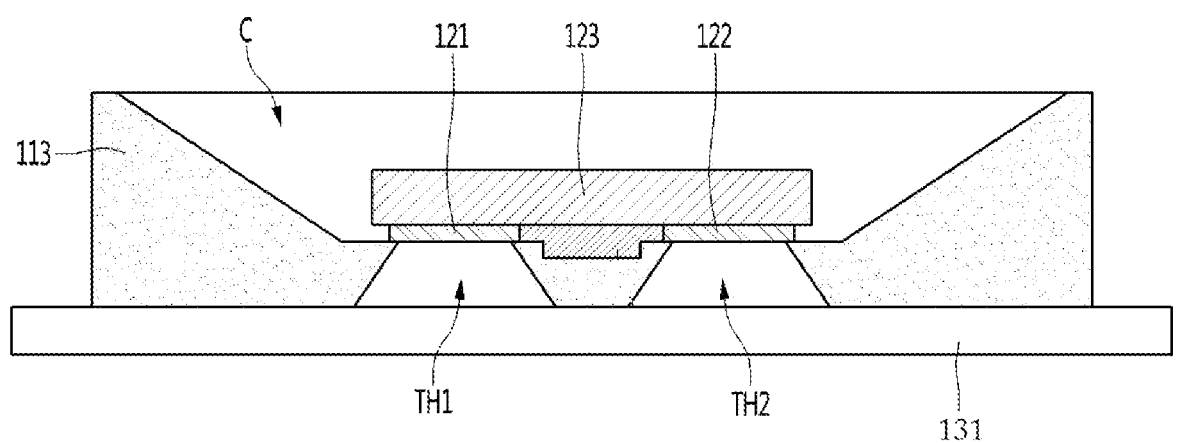
FIG. 3 illustrates an exemplary embodiment of a semiconductor light emitting device disclosed in Korean Patent Application Laid-Open No. 10-2018-0131303.
Figure 4B:
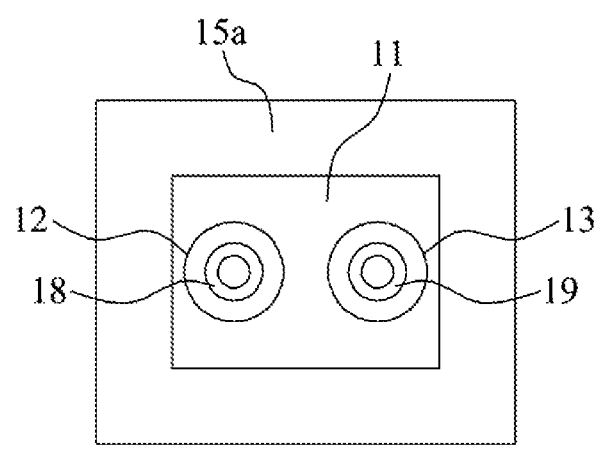

A conductive paste (e.g., Ag, Cu), a soldering material (e.g., SAC), etc. may be employed for bonding of the semiconductor light emitting chip 11 and the conductive parts 18 and 19, as in the prior art, and a non-conductive adhesive ① (e.g., a silicone adhesive) may be applied to multiple regions to ensure physical bonding between the chip and the conductive parts. Additionally, or alternatively, the semiconductor light emitting chip 11 may be physically attached to the mold 14 using the non-conductive paste only, and later, to the external substrate 131 (see FIG. 3) by introducing a conductive paste or a soldering material into the partially filled through holes 16 and 17 to ensure the electrical connection with the external substrate. FIG. 4B shows a top view of the semiconductor light emitting device, in which the hollow, circular conductive parts 18 and 19 are combined with the circular electrodes 12 and 13.

Figure 5A:
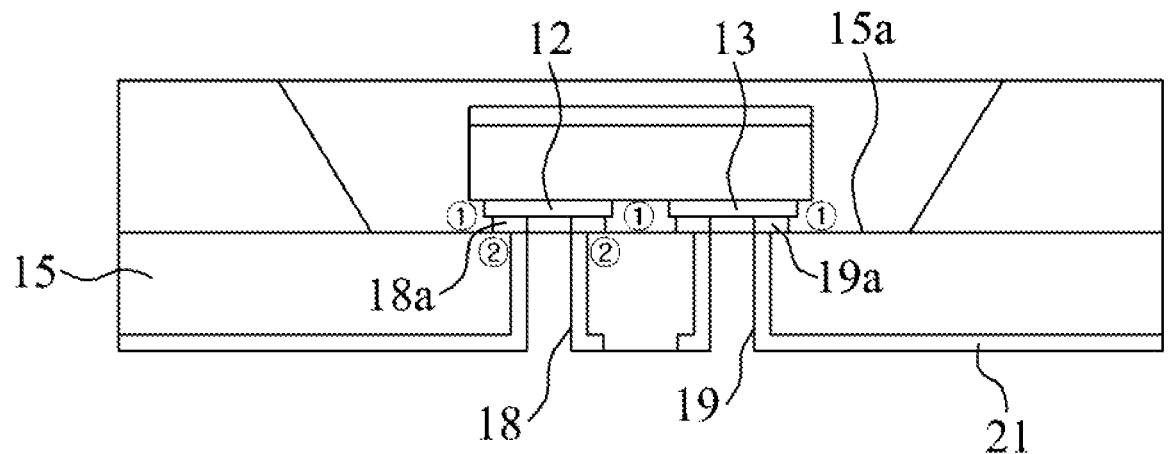
FIG. 5 illustrates another exemplary embodiment of a semiconductor light emitting device according to the present disclosure.
Figure 5B:
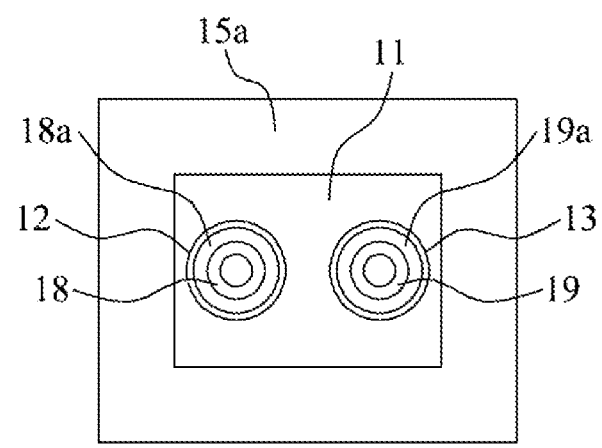

FIG. 5 illustrates another exemplary embodiment of a semiconductor light emitting device according to the present disclosure. Here, the upper side 15a of the bottom portion 15 is also laser ablated as shown in FIG. 5A, such that upper metal layers 18a and 19a have a laser ablated design pattern. The conductive parts 18 and 19, the heat dissipation metal layer 21, and the upper metal layers 18a and 19a can be formed all together during electroless plating. Further, in addition to the non-conductive adhesive ①, a conductive adhesive ② (e.g., a soldering material) may be employed for bonding of the upper metal layers 18a and 19a and the electrodes 12 and 13. In doing so, stable electrical/physical bonding is secured even before the semiconductor light emitting device is connected to the external substrate 131 (see FIG. 3). This stability was demonstrated in a reliability test. Referring to FIG. 5B, the upper metal layers 18a and 19a may be formed smaller than the electrodes 12 and 13 to cause light absorption by the upper metal layers 18a and 19a to be reduced.

Figure 6A:
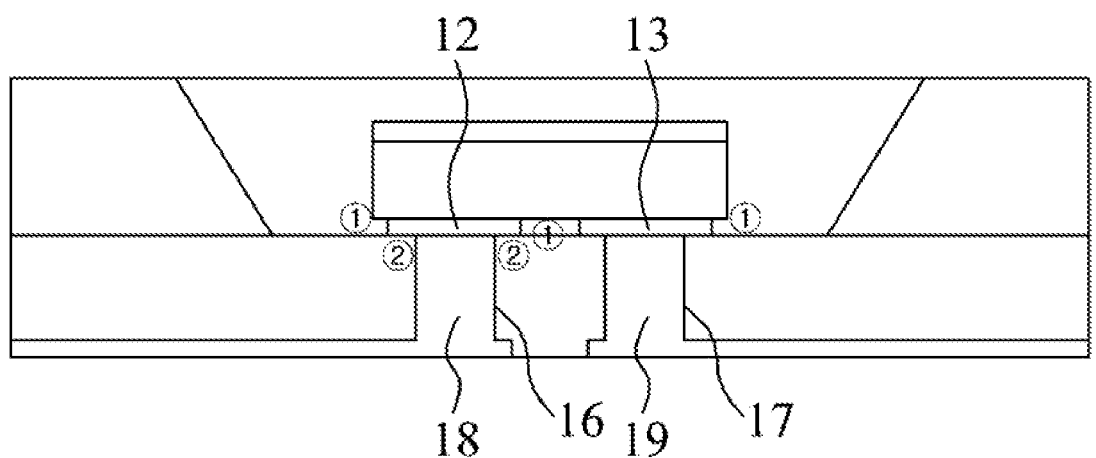
FIG. 6 illustrates another exemplary embodiment of a semiconductor light emitting device according to the present disclosure.
Figure 6B:
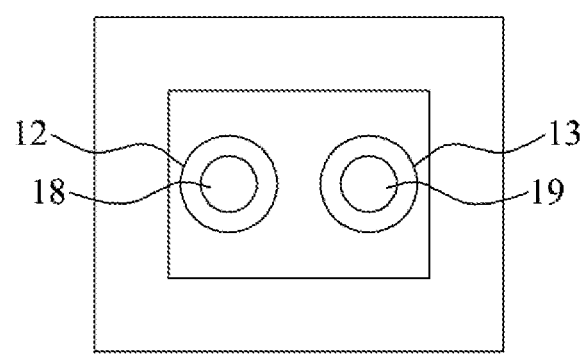

FIG. 6 illustrates another exemplary embodiment of a semiconductor light emitting device according to the present disclosure. Here, the through holes 16 and 17 are filled with the conductive parts 18 and 19, as shown in FIG. 6A. The conductive adhesive ② is employed for bonding of the conductive parts 18 and 19 and the electrodes 12 and 13. Filling can be achieved by electroless plating, or by heat treatment where a conductive paste material containing a high-temperature solder, Ag and Cu is treated at a temperature of 250° C. or higher. The electroless plating process is preferred. Unlike the semiconductor light emitting device illustrated in FIG. 4, the through holes 16 and 17 in this semiconductor light emitting device are filled, providing improved heat dissipation performance and increased bonding strength with an external substrate, although it might take some time to fill the through holes 16 and 17.

In an implementation of the semiconductor light emitting devices illustrated in FIGS. 4-6, the first additive used as a primary component in the LDS process and/or the second additive used to improve heat dissipation performance are preferably added to the mold 14 to a very limited extent (e.g., 10 wt. % or less) since they are typically not involved in light reflection. In other words, although these additives are optimized for the LDS process, their reflectance is not high. To resolve this problem, therefore, a nanoscale (nano-dimensioned) particle material can be added to the mold 14 that can be activated on its own or by laser irradiation and serve as seeds for plating, while showing a low absorption and high transparency for visible light. Examples of such a nanoscale (nano-dimensioned) particle material may include, but without limitation, metals (e.g., Ag) and metal oxides (e.g., $Al_2O_3$, $SiO_2$, $TiO_2$, $SnO_2$, $In_2O_3$, ITO, $ZrO_2$, ZnO, $CeO_2$, $Ta_2O_5$). For example, the mold 14 may be formed using a blend of PCT with a certain amount of ZnO and nanoscale Ag particles.

Figure 7A:
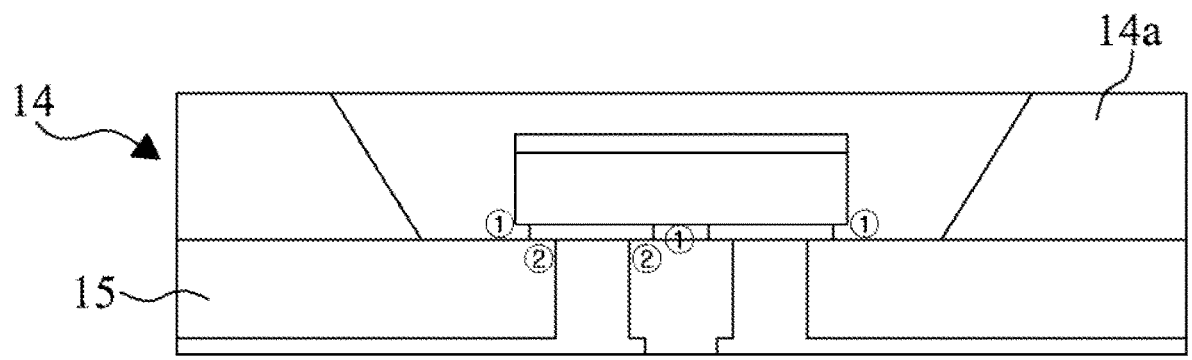
FIG. 7 illustrates another exemplary embodiment of a semiconductor light emitting device according to the present disclosure.
Figure 7B:
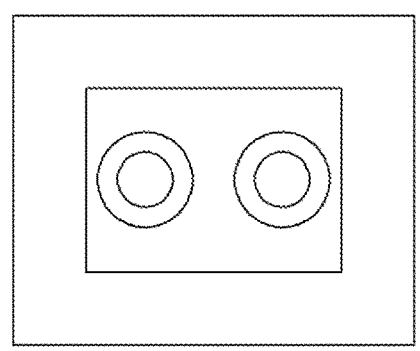

FIG. 7 illustrates another exemplary embodiment of a semiconductor light emitting device according to the present disclosure. Here, the reflective wall 14a and bottom portion 15 of the mold 14 are made of different materials. That is, the reflective wall 14a contains the molding resin, $TiO_2$ for light reflection, and $SiO_2$ or $Al_2O_3$ as a light scattering (or diffusing) agent. Meanwhile, the bottom portion 15 contains the first and second LDS additives (e.g., $Cu_2O$, NiO, $Cr_2O_3$, PdO or other LDS additives) for light absorption. These materials can be present in any combination of at least two, or a sequentially varying combination. Such composition is particularly useful if the mold 14 contains LDS additives. Thus, the mold 14 can be molded by injecting these molding materials in a sequentially varying combination, or by injecting different molding materials into an upper mold corresponding to the reflective wall 14a and a lower mold corresponding to the bottom portion 15.

Figure 8A:
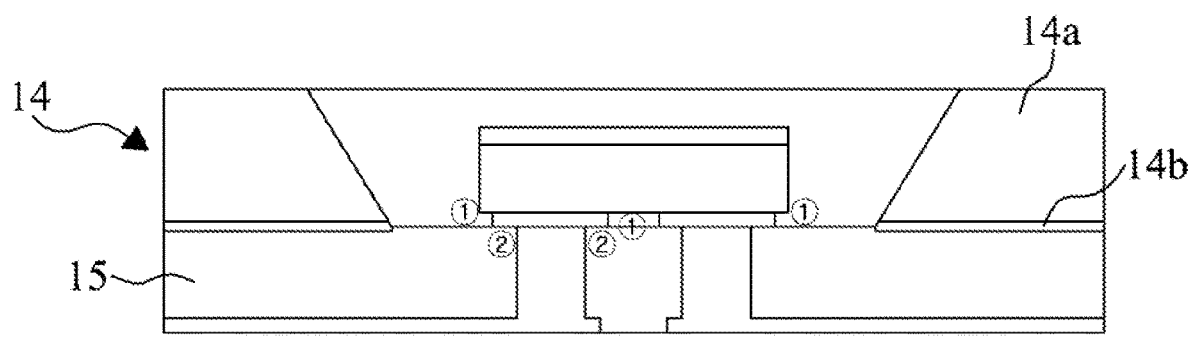
FIG. 8 illustrates another exemplary embodiment of a semiconductor light emitting device according to the present disclosure.
Figure 8B:
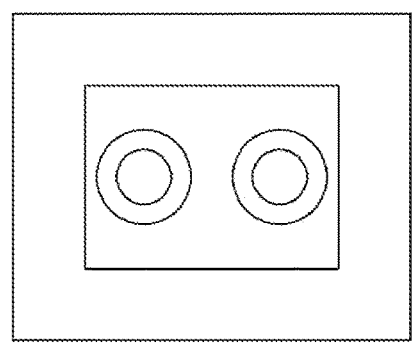

FIG. 8 illustrates another exemplary embodiment of a semiconductor light emitting device according to the present disclosure. Here, the reflective wall 14a and bottom portion 15 of the mold 14 are not only made of different materials, but they are also bonded with an adhesive 14b, instead of being molded all at once in a body.

In an implementation of the semiconductor light emitting devices illustrated in FIGS. 7-8, the bottom portion 15 of the mold 14 and the reflective wall 14a of the mold 14 may be injection molded in the form of a single part or separated parts, in which an amount of the first and second additives contained in the bottom portion 15 of the mold 14 is relatively larger than the amount of the first and second additives contained in the reflective wall 14a.

Figure 9A:
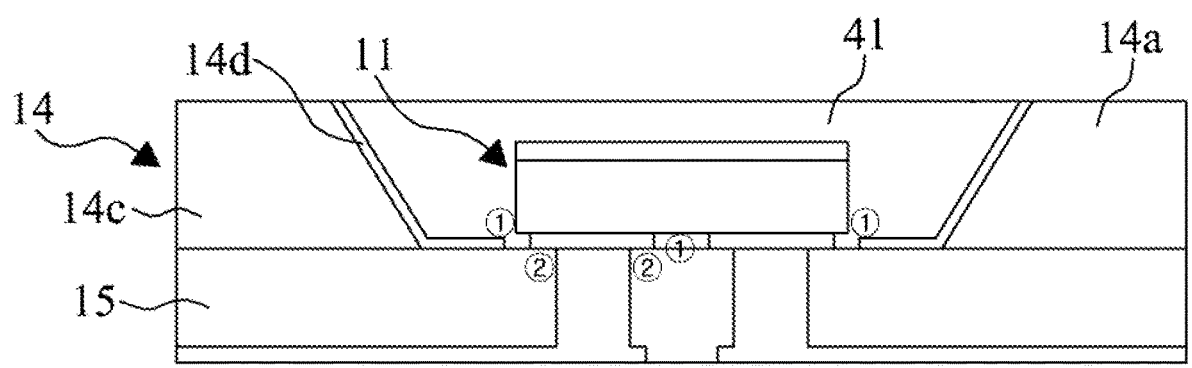
FIG. 9 illustrates another exemplary embodiment of a semiconductor light emitting device according to the present disclosure.
Figure 9B:
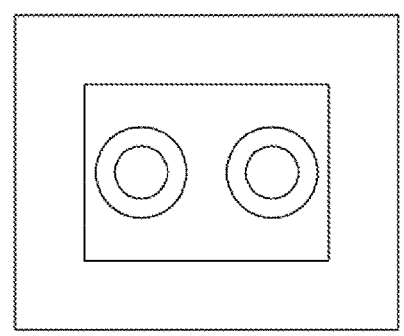

FIG. 9 illustrates another exemplary embodiment of a semiconductor light emitting device according to the present disclosure. Here, the mold 14 includes a matrix 14c of a material capable of reflecting at least 95% of the light generated by the semiconductor light emitting chip 11 (e.g., a polymer used in LDS), and a reflective layer 14d coated on the matrix. The reflective layer 14d may include, for example, Ag, Cr/Ag, Cu/Ag, Al, Cr/Al, Cu/Al, Au, Cr/Au, Cu/Ni/Au, DBR, White resin, or PSR. A recessed space called a cavity 41 is defined by the reflective wall 14a and the bottom portion 15, and the reflective layer 14d is formed inside the cavity 41 of the mold 14. A material suitable for drilling and plating and a material suitable for light reflection may be combined to form the mold 14.

Figure 10:
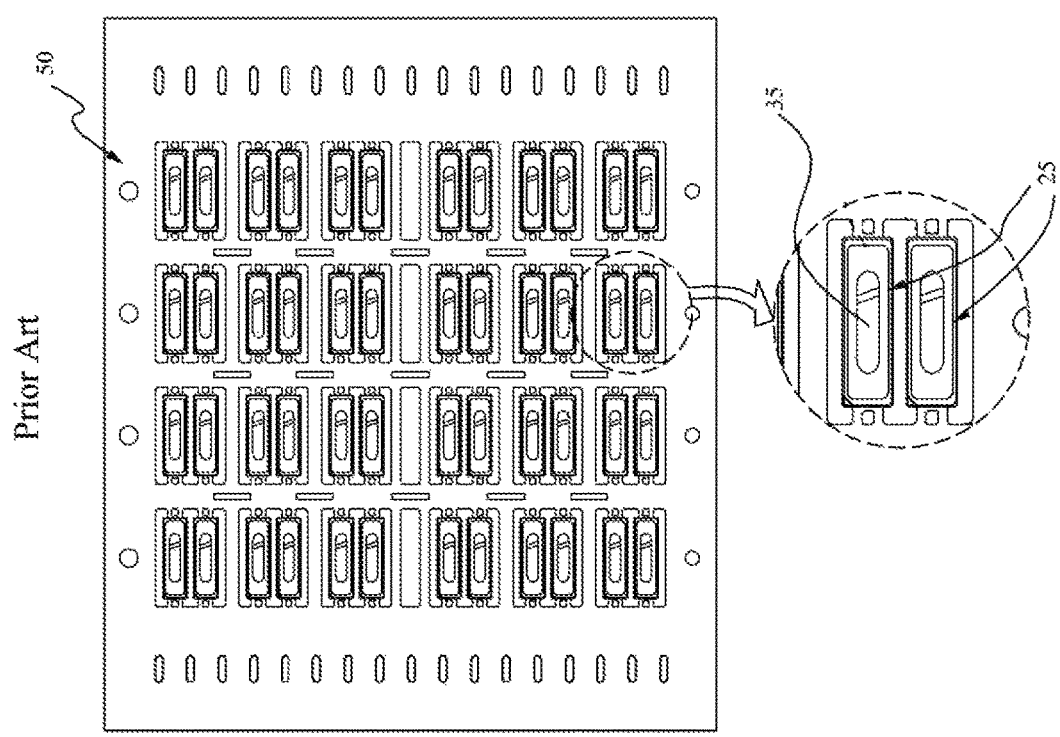
FIG. 10 illustrates an individual type of lead frame and molds described in U.S. Patent Application Publication No. 2014/0054078.

FIG. 10 illustrates an individual type of lead frame 50 and molds 25 described in U.S. Patent Application Publication No. 2014/0054078, in which each of the molds 25 is formed independently with at least one side being separated from each other. Alternatively, though the exemplary embodiments described above are not provided with a lead frame or lead electrode and therefore there is no electrical connection between the lead frame or lead electrode and the semiconductor light emitting chip 11 (see FIG. 4), the lead frame or lead electrode 50 may pass through the molds 25, detouring or deflecting the bottom portion 35 thereof (e.g., U.S. Pat. No. 10,008,648). For mass production, it is preferred that multiple molds 25 are formed across the lead frame 50.

Figure 11A:
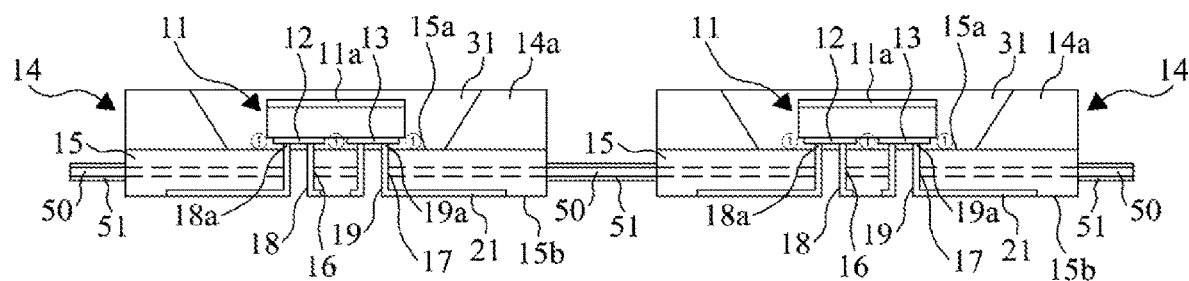
FIG. 11 shows a method for manufacturing a semiconductor light emitting device according to the present disclosure.
Figure 11B:
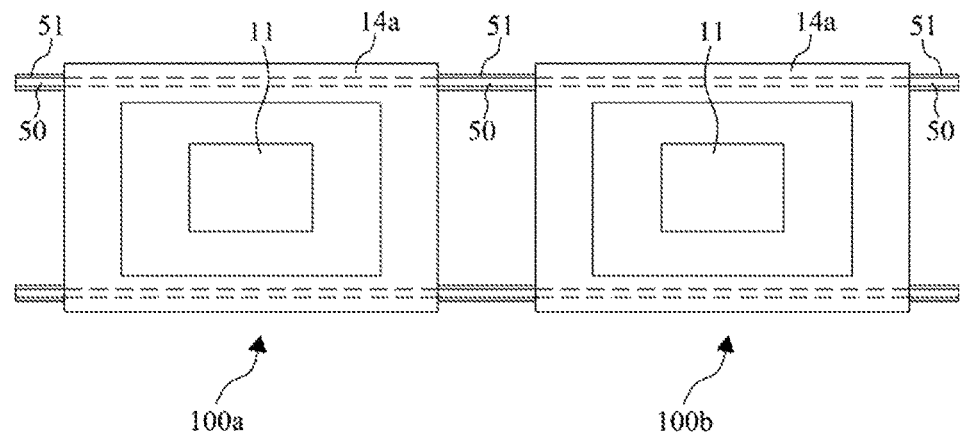

FIG. 11 shows a method for manufacturing a semiconductor light emitting device according to the present disclosure, and two semiconductor light emitting devices 100a and 100b are presented for convenience of description. As shown, the mold 14 of each semiconductor light emitting device 100a or 100b is integrally formed with the lead frame 50, and an anti-plating layer 51 is formed on a region of the lead frame 50 that is exposed from the mold 14. The presence of the anti-plating layer 51 on the exposed region of the lead frame 50 allows to stably form a plating layer on other parts, namely, each of the conductive parts 18 and 19, the upper metal layers 18a and 19a and/or the heat dissipation metal layer 21. Except that the anti-plating layer 51 is formed on the exposed region of the lead frame 50 from the mold 14, the exemplary embodiments illustrated in FIGS. 4-9 are manufactured, undergoing the same subsequent processes. In due course, the exposed region of the lead frame 50 is cut out and an individual semiconductor light emitting device is obtained. Additionally, or alternatively, the anti-plating layer 51 may be formed on the entire lead frame 50, and the multiple molds 14 may be integrally formed with the lead frame 50 by injection molding, for example. Moreover, having the anti-plating layer 51 on the exposed region of the lead frame 50 from the mold 14 does not necessarily exclude the possibility of having an electrical connection between the lead frame 50 and the semiconductor light emitting chip 11. The anti-plating layer 51 can be obtained by coating of an insulating layer, for example. If the mold 14 is not coated with the insulating layer, an electrical insulating layer may be provided by electro-deposition coating. On the other hand, if the mold 14 needs to be coated, e.g., with an insulating material, it can be done with any suitable method. For example, when the mold 14 is black, the lead frame 50 including the mold may be coated with a white insulating material in order to increase the reflectance of the semiconductor light emitting chip 11.

Further, according to the present disclosure, any material showing a low absorption and high transparency for visible light, e.g., a nanoscale (nano-dimensioned) particle material including, but without limitation, metals (e.g., Ag) or metal oxides (e.g., $Al_2O_3$, $SiO_2$, $TiO_2$, $SnO_2$, $In_2O_3$, ITO, $ZrO_2$, ZnO, $CeO_2$, or $Ta_2O_5$) may be added additionally, or alternatively, to the first, second and/or third additives. Therefore, the problems due to the usage of an additive optimized for LDS but having a lower transparency may be resolved by providing the mold 14 with a material that has a high transparency and can possibly be activated on its own or by laser irradiation to serve as a seed for plating. For example, the mold 14 may be formed using a blend of PCT with a certain amount of ZnO and nanoscale Ag particles.

Figure 12:
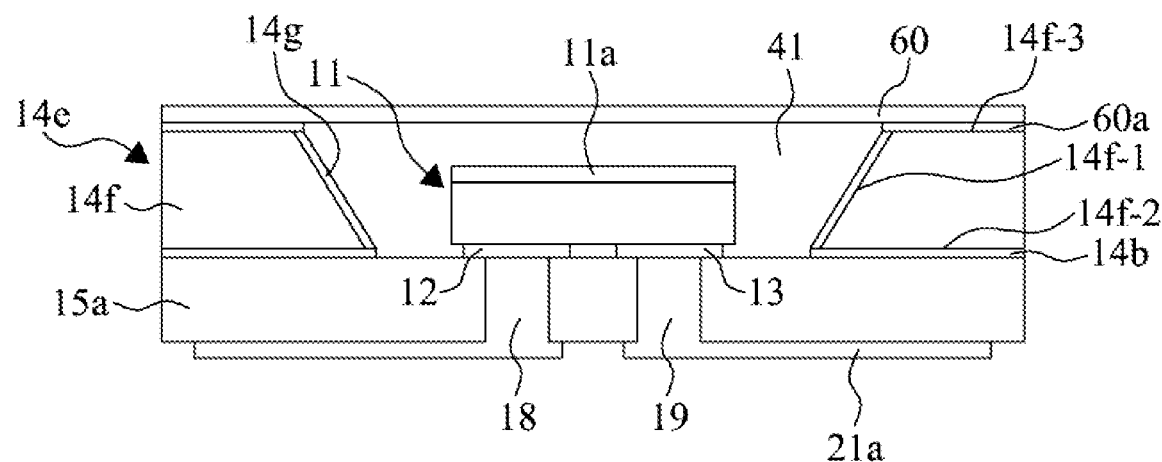
FIG. 12 illustrates another exemplary embodiment of a semiconductor light emitting device according to the present disclosure.

FIG. 12 illustrates another exemplary embodiment of a semiconductor light emitting device according to the present disclosure. This semiconductor UV light emitting device incorporates the technical idea of the disclosure. As shown, the semiconductor light emitting device includes a semiconductor light emitting chip 11 and a body 14e. Preferably, it has a window 60 (e.g., quartz, sapphire). The semiconductor light emitting chip 11 emits UV light. Generally, UV light is categorized into UVA (400-315 nm), UVB (315-280 nm), and UVC (280-100 nm), depending on its wavelength. The body 14e has a reflective wall 14f and a bottom portion 15a, together defining a cavity 41. The reflective wall 14f has a reflective layer 14g. Unlike in the case of previous exemplary embodiments, the bottom portion 15a is comprised of a single crystal sapphire substrate or a ceramic substrate of sintered AlN, $Al_2O_3$ or $SiN_x$. The bottom portion 15a includes conductive parts 18 and 19. If needed, it may further include a heat dissipation metal layer 21a. One example of the bottom portion 15a is described in U.S. Patent Application Publication No. 2017-0317230. The reflective layer 14g is formed by applying the LDS process to the reflective wall 14f. Given that the LDS process can be carried out, the reflective wall 14f may have any shape without particular limitations, independently of the reflectance for the light generated by the semiconductor light emitting chip 11. It is understood that white resins such as PPA, PCT, EMC, SMC, etc. conventionally used for infrared and visible lights are not always simple to use or suitable for UV light of shorter wavelengths. According to the present disclosure, the reflective wall 14f may be made of any material suitable for the LDS process, while the reflective layer 14g may be made of a material selected depending on wavelength of the light generated by the semiconductor light emitting chip 11 (e.g., Ag for UVA, and Al for UVB and UVC). As mentioned in FIG. 9 above, additionally, or alternatively, a sequentially varying combination of highly adhesive metals (e.g., Cu, Cr, Ni) and highly reflective metals (e.g., Ag, Al) may also be employed. Examples thereof include, but without limitation, Ag, Cu/Ni/Au/Ag, Cu/Ni/Sn/Ag, Cr/Ag, Cu/Sn/Ag, Al, Cu/Ni/Al, Cu/Ni/Sn/Al, Cr/Al, or Cu/Sn/Al.

Figure 18:
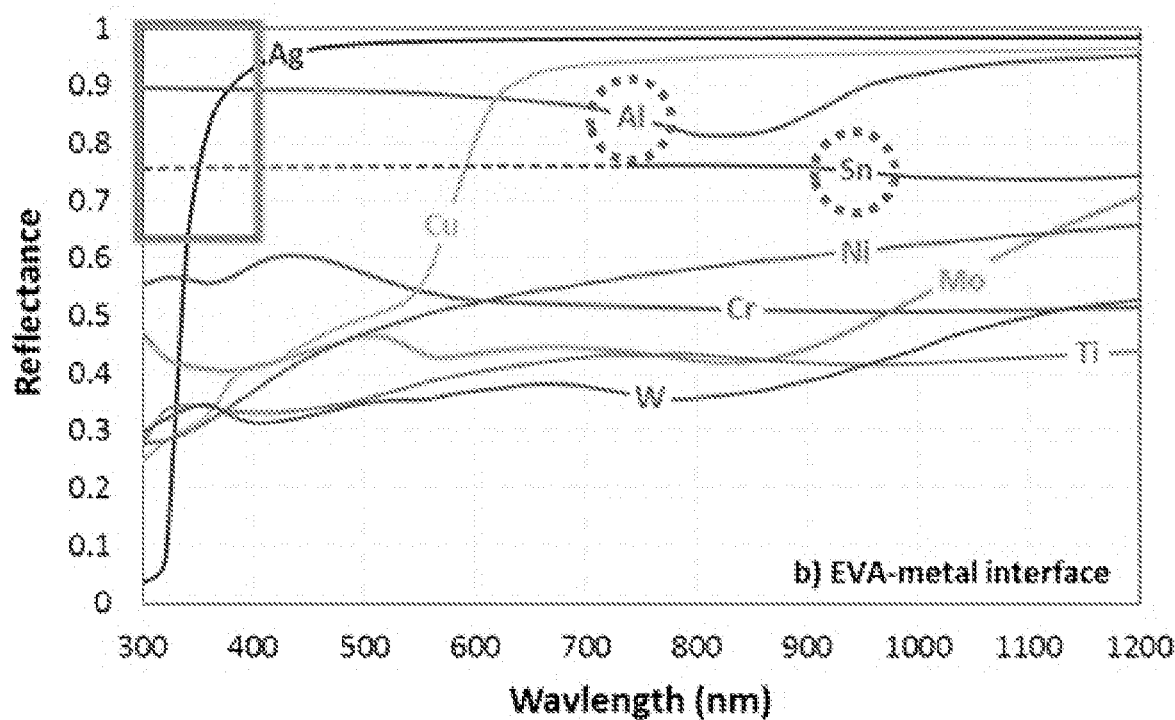
FIG. 18 is a plot of reflectance vs wavelength for different metals.

If the bottom portion 15a is comprised of a ceramic substrate, the reflective wall 14f and the reflective layer 14g are generally prepared in two processes. To improve structural stability, optical performance and quality with reduced manufacturing cost, additional processes may be added, or the processes can be carried out in a different order. A certain outer edge section of the bottom portion 15a having the conductive parts 18 and 19 and a surface reflective layer (not shown) can be bonded to the reflective wall 14f, without using a separate bonding layer 14b (this is called an integration process). Alternatively, the bottom portion 15a can be bonded to the reflective wall 14f, using a separate bonding layer 14b (this is called a hybrid process). In case of the integration process, the reflective wall 14f and the bottom portion 15a are integrated (i.e., the reflective wall 14f is injection molded to the bottom portion 15a), and a laser beam is irradiated onto the reflective wall 14f including its slanted side 14f-1 as well as its upper side 14f-3 and/or stepped sides 14f-21 and 14f-22 (see FIG. 15) to activate and make them serve as seeds for electroless plating. In case of the hybrid process, however, the bottom portion 15a and the reflective wall 14f are separately prepared, and laser beam irradiation and electroless plating are consecutively carried out on a lower side 14f-2 of the reflective wall 14f before the bonding layer 14b is introduced to put the reflective wall and the bottom portion together. Although the hybrid process has an extra integrating step compared with the integration process, it is expected that the hybrid process would provide strong bonding. Additionally, or alternatively, in the hybrid process, not only the lower side 14f-2 of the reflective wall 14f, but the slanted side 14f-1, upper side 14f-3, and/or stepped sides 14f-21 and 14f-22 of the reflective wall 14f may also be subjected to the laser beam irradiation all at once to be activated for electroless plating. In an alternative, after electroless plating (e.g., Cu/Ni/Sn) is carried out on the slanted side 14f-1 of the reflective wall 14f as well as on the upper side 14f-3 and/or stepped sides 14f-21 and 14f-22 of the reflective wall 14f, Al or Ag can be deposited by a PVD process to form the reflective layer 14g. In another alternative, the reflective wall 14f may be plated with a metal suitable for LDS (e.g., Cu or Cu/Ni), and then electroplated with Sn because Sn has an excellent reflectance of 0.7 or higher even in the UV region and demonstrates excellent bonding strength when combined with the bonding layer 14b, as illustrated in FIG. 18. If applied directly onto Cu, Sn can also contribute to prevent oxidation of Cu. Additionally, or alternatively, (i) after Sn is electroplated, a metal having a higher reflectance than Sn (e.g., Al, Rh, or Ag) may be added to form the reflective layer 14g, in the form of, for example, but without limitation, electroplated Cu/electroplated Sn/Al, electroplated Cu/electroplated Sn/Rh, electroplated Cu/electroplated Sn/Ag, electroplated Cu/electroplated Ni/electroplated Sn/Al, electroplated Cu/electroplated Ni/electroplated Sn/Rh, or electroplated Cu/electroplated Ni/electroplated Sn/Ag. Al and Rh are particularly suitable for UV light of shorter wavelengths (e.g., UV-C, B). If Sn is applied onto the lower side 14f-2, a metal having a higher reflectance than Sn (e.g., Al, Rh, or Ag) is not applied onto the lower side 14f-2, in order to let Sn used for bonding with the bonding layer 14b. Thus, PVD, instead of plating, is employed to prevent the formation of a metal having a higher reflectance (e.g., Al, Rh, or Ag) on the lower side 14f-2; (ii) after Sn is electroplated, a transparent oxide (e.g., $SnO_2$, $SiO_2$, or ZnO) can be deposited (e.g., by PVD) to protect Sn from discoloration and degradation in quality; or (iii) after Sn is electroplated, a transparent Sn oxide ($SnO_2$) film may be coated by $O_2$ plasma treatment. Independently of the type of materials (e.g., Sn, Ni, Cu, etc.) used, the electroplating process, compared with the electroless plating process, applies a more uniform and stronger electrical energy, which in turn enables to form a conductive film of uniform thickness and high density. In addition, the process time can be shortened. Therefore, it is preferable that Sn is utilized for electroplating. Examples of materials for the bonding layer 14b may include, but without limitation, a soldering material such as Au—Sn, Ni—Sn, Au—Ni—Sn, Au—In, Pd—In, Cu—Sn, or Au—Cu—Sn, a paste material such as Ag powder, Cu powder, or ESP (Epoxy Silicone Paste), or an adhesive material such as silicone or epoxy.

According to the present disclosure, the bottom portion 15a may be comprised of a ceramic (e.g., sapphire (6.5 ppm), sintered $Al_2O_3$ (7 ppm), sintered AlN (4.8 PPM), and sintered $SiN_x$ (2.8 ppm)) substrate that has a thermal expansion coefficient not much different from that of the growth substrate 11a (in case of a flip chip) or the support substrate (not shown) (in case of a vertical chip) of the semiconductor light emitting chip 11. For example, (i) in case of a flip chip (namely, if the sapphire growth substrate 11a is retained or not removed), sapphire, sintered $Al_2O_3$, or sintered AlN is preferentially employed; (ii) in case of a vertical chip (namely, if the growth substrate 11a is removed and a growth substrate (e.g., MoCu (6.5 ppm)) is used instead), sapphire, $Al_2O_3$, or sintered AlN is again preferentially employed; and (iii) in another case of a vertical chip (namely, if the growth substrate 11a is removed and a growth substrate (e.g., Si (2.3 ppm)) is used instead), sintered AlN or sintered $SiN_x$ is preferentially employed. With such a ceramic substrate as the bottom portion 15a, it is possible to prevent separation of the electrodes 12 and 13 from the conductive parts 18 and 19 even when the semiconductor light emitting chip 11 is flip bonded, and to restrict thermal expansion of the conductive parts 18 and 19 as the ceramic substrate has a thermal expansion coefficient that is essentially not too high (e.g., 3-7 ppm). Therefore, the semiconductor UV light emitting chip 11 of the present disclosure has advantages as follows: (i) any issue involved with degradation of the mold 14 based on resins such as PPA, PCT, EMC or SMC can be overcome; (ii) the electrodes 12 and 13 are not easily separated by providing the bottom portion 15a comprised of a ceramic substrate that has a thermal expansion coefficient not too high and not much different from that of the growth substrate 11a (flip chip) or the support substrate (not shown) (vertical chip); (iii) the conductive parts 18 and 19 can be stably anchored; and (iv) the reflective wall 14f has a matrix (e.g., thermoplastics or thermosetting plastics) suitable for injection molding, and the reflective layer 14g is formed by the LDS process. In this regard, it is important that the cavity 41 in the semiconductor UV light emitting chip 11 has a slated reflective wall 14f. If the reflective wall 14f is entirely made of metals, it is hard to make it slanted or to adjust its slope. In this regard, the reflective wall 14f may be prepared by injection molding of a resin-based material so that the slanted side 14f-1 of a desired shape (circular, quadrangular, or polygonal) and angle can be obtained. However, the resin-based material is not usually applicable as it is. Additionally, or alternatively, a metal coating may be applied onto the resin-based reflective wall 14f, but the metal coating is unlikely to be stably retained for an extended period of time (e.g., at least 10,000 hours). However, this is resolved by preparing the reflective layer 14g using the LDS process, according to the present disclosure. In an alternative to the reflective wall 14f containing at least one LDS additive that is activated by a laser beam and serves as a seed for electroless plating, it is also envisaged that the reflective wall 14f is comprised of a Si semiconductor 100 because the Si semiconductor 100 having crystal planes are (i) better adapted to adjustment of the slanted side 14f-1 through KOH wet etching and/or dry etching, and (ii) excellent in adhering to a metal (e.g., Al or Ag) of the reflective layer 14g. Additionally, or alternatively, the reflective wall 14f may be made of any material without particular limitations, provided that these two conditions (i) and (ii) described above are satisfied. If the reflective wall 14f is comprised of the Si semiconductor 100, the bottom portion 15a made of $SiN_x$ (2.8 ppm) or AlN (4.8 ppm), rather than sapphire (6.5 ppm) and $Al_2O_3$ (7 ppm) is preferentially used, taking a thermal expansion coefficient of the Si semiconductor (2.5 ppm) into consideration.

Figure 13:
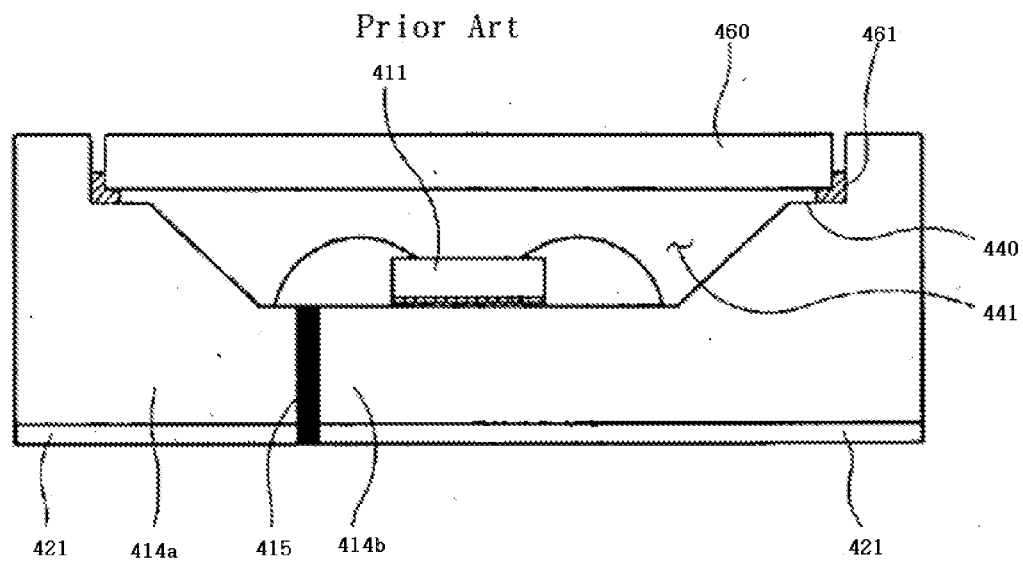
FIG. 13 illustrates an exemplary embodiment of a semiconductor light emitting device disclosed in U.S. Patent Application Publication No. 2014/0367718.

FIG. 13 illustrates an exemplary embodiment of a semiconductor light emitting device disclosed in U.S. Patent Application Publication No. 2014/0367718. Here, the semiconductor light emitting device includes a semiconductor light emitting chip 411 and two metal bodies 414a and 414b. These two metal bodies 414a and 414b are electrically insulated by an insulating layer 415. Each of the metal bodies 414a and 414b has a cavity 441 and a holding portion 440. A window 460 is held on the holding portion 440 using an adhesive 461. Additionally, or alternatively, a heat dissipation metal layer 421 is provided. Although these metal bodies 414a and 414b may be useful for increasing the reflectance of UV light, it is not easy to form a slanted side 14f-1 on them as mentioned earlier, and a related machining process is pricey. Moreover, their high thermal expansion coefficients (19-23 ppm) also make it difficult to keep them from being separated from the semiconductor light emitting chip 411.

Figure 14:
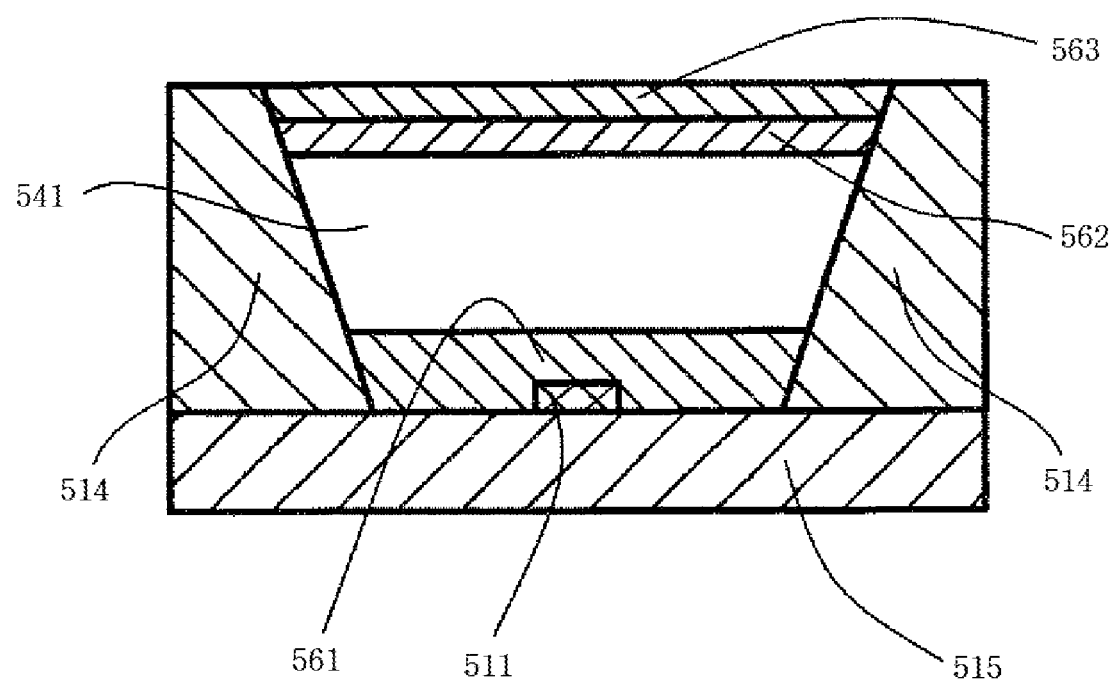
FIG. 14 illustrates an exemplary embodiment of a semiconductor light emitting device disclosed in U.S. Pat. No. 8,106,584.

FIG. 14 illustrates an exemplary embodiment of a semiconductor light emitting device disclosed in U.S. Pat. No. 8,106,584. Here, the semiconductor light emitting device includes a semiconductor light emitting chip 511, a reflective wall 514, a bottom portion 515, a cavity 541, a light transmitting part 561, a first window 562, and a second window 563. The reflective wall 514 is secured on the bottom portion 515 and has a light-reflecting inner surface slanted upwards, surrounding the semiconductor light emitting chip 511. The reflective wall 514 may be made of a metal (e.g., Al, or an alloy of Fe—Ne—Co), sintered $Al_2O_3$, an epoxy resin, or the like. The bottom portion 515 has a wire conductor (not shown) for supplying current to the semiconductor light emitting chip 511, covering from the upper side to the lower or lateral sides of the bottom portion 515. The bottom portion 515 may be made of sintered $Al_2O_3$, sintered AlN, sintered mullite, glass ceramics, an epoxy resin, a metal, or the like. Although this semiconductor light emitting device in FIG. 14 may be very similar to the semiconductor light emitting device according to the present disclosure in that its bottom portion 515 can be comprised of sintered $Al_2O_3$ or sintered AlN, it does not have the configuration and slanted inner surface of the reflective wall 514 and enhanced long-term reliability related qualities including reflectance and durability of the inner surface, as found in the present disclosure. For example, the semiconductor light emitting device shown in FIG. 14 has the bottom portion 515 made of sintered $Al_2O_3$ or sintered AlN and the reflective wall 514 made of an epoxy resin, as claimed. Unfortunately, this conventional reflective wall 514 made of an epoxy resin not only absorbs light in the UV wavelength range, but it is also subjected to UV-induced degradation due to aging. To prevent this, the slanted side of the reflective wall 514 could be coated with a reflective layer (Ag or Al), but hydrophobic interactions (physical contacts), not hydrophilic interactions (chemical contacts), between the epoxy resin of the reflective wall 514 and the reflective layer coated on the slanted side of the reflective wall 514 may lead to weaker bonding, failing to compromise degradation in long-term reliability related qualities. In contrast, according to the present disclosure, the reflective wall 14f made of a resin suitable for LDS and the reflective layer (Ag or Al) coating provides hydrophilic interactions that demonstrate strong bonding strength between materials, which in turn ensures long-term reliability.

Further, the present disclosure provides means (using metallic bonding) for improving the overall waterproof function of the semiconductor light emitting device, by introducing the reflective layer 14g made of a metal demonstrating strong bonding strength towards the reflective wall 14f made of a resin suitable for LDS or comprised of a Si semiconductor 100. In particular, in case of the reflective wall 14f made of a resin suitable for LDS, the reflective layer 14g is formed on the slanted side 14f-1 of the reflective wall, and the lower and upper sides 14f-2 and 14f-3 of the reflective wall 14f undergo laser irradiation followed by electroless plating for metal treatment and are coupled with the bottom portion 15a and the window 60 by eutectic bonding or soldering 14b, 60a, thereby improving the waterproof function of the device. In case of the reflective wall 14f comprised of a Si semiconductor 100, the Si semiconductor undergoes metal treatment and the resulting, metal-treated Si semiconductor 100 is coupled with the bottom portion 15a and the window 60 by eutectic bonding or soldering 14b, 60a, thereby improving the waterproof function of the device. More preferably, the electrodes 12 and 13 of the semiconductor light emitting chip 11 and the conductive parts 18 and 19 of the bottom portion 15a are coupled by Au 80%-Sn 20% eutectic bonding at a relatively high temperature (300° C. or lower). After that, the bottom portion 15a and the reflective wall 14f undergo high-temperature soldering (280° C. or lower) using the soldering material 14b, and the window 60 and the reflective wall 14f undergo low-temperature soldering (260° C. or lower) using the soldering material 60a. In result, the semiconductor light emitting chip 11 is not separated during the manufacturing process, and the overall waterproof function of the semiconductor light emitting device can be improved. In an alternative, the reflective wall 14f and the bottom portion 15a can be coupled by metallic bonding, after the reflective wall 14f and the window 60 are first coupled.

The application of the LDS process on an injection molded article used as the reflective wall 14f involves employing an LDS mold matrix resin (thermosetting plastics or thermoplastics) that contains LDS additives (e.g., organic metal compounds or metal particles), in which an injection molded article prepared or molded with such a mold matrix resin is irradiated on its surface with a laser beam so that the surface may have a high roughness and be electrically activated, and the laser-irradiated region of the surface undergoes electroless plating, producing a conductive material thereon. The LDS mold matrix resin can be thermoplastics (e.g., polyphthalamide (PPA) or polycyclohexylene dimethylene terephthalate (PCT)) or thermosetting plastics (e.g., epoxy mold compounds (EMC) or silicone molding compounds (SMC)). Specific examples of the LDS mold matrix resin may include, but without limitation, ABS (acrylonitrile-butadiene-styrene), PC (polycarbonate), PET (polyethylene terephthalate), PA (polyamides), PPA (polyphthalamide), PBT (polybutylene terephthalate), COP (cyclic olefine copolymer), PPE (polyphenylene ether), LCP (liquid crystal polymer), PEI (polyetherimide), PEEK (poly ether ether ketone), and the like. The LDS additives include a blend of a first additive that is a primary component and serves as a seed in the LDS mold matrix resin upon laser-beam irradiation, and additionally, a second additive that is used to improve heat dissipation performance. In general, the first additive includes at least one of:

Pd-based heavy metal complexes and metal oxides, metal oxide-coated fillers, CuO·Cr$_2$O$_3$ spinel, copper salts, copper hydroxyphosphate, copper phosphate, cuprous thiocyanate, spinel-based metal oxides, CuO·Cr$_2$O$_3$, organometallic complexes, antimony (Sb) doped Sn oxide, or metal oxides containing Cu, Zn, Sn, Mg, Al, Au, Ag, Ni, Cr, Fe, V, Co, or Mn. The second additive, which is one of functional additives, used to improve heat dissipation performance includes at least one of: AlN, AlC, Al$_2$O$_3$, AlON, BN, MgSiN$_2$, Si$_3$N$_4$, SiC, graphite, graphene, carbon fiber, ZnO, CaO, or MgO.

Figure 15:
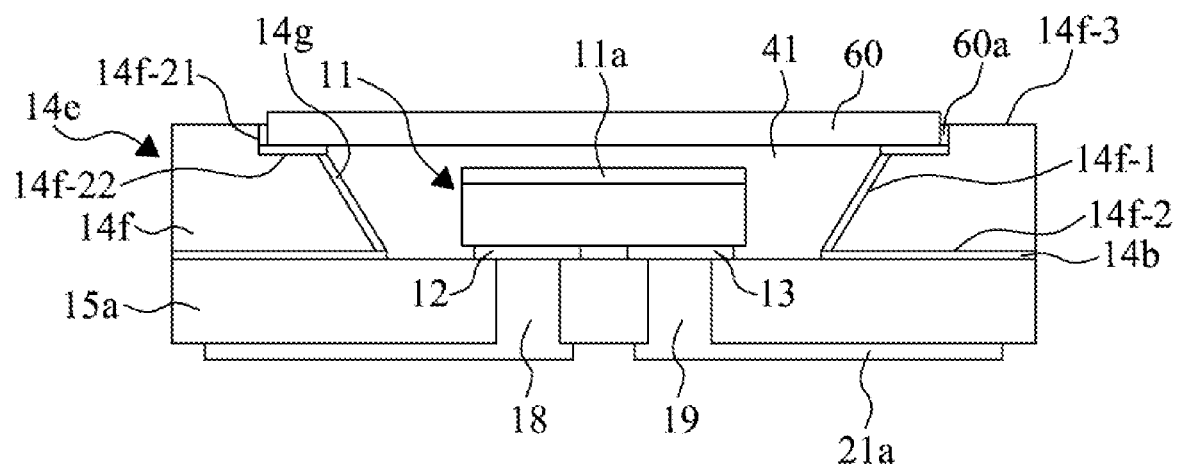
FIG. 15 illustrates another exemplary embodiment of a semiconductor light emitting device according to the present disclosure.

FIG. 15 illustrates another exemplary embodiment of a semiconductor light emitting device according to the present disclosure. Here, the stepped sides 14f-21 and 14f-22 are formed on the upper side 14f-3 of the reflective wall 14f to be coupled with the window 60. After the stepped sides 14f-21 and 14f-22 undergoes metal treatment through the LDS process, the window 60 and the reflective wall 14f are coupled by metallic bonding such that more stable coupling may be achieved between them.

Figure 16A:
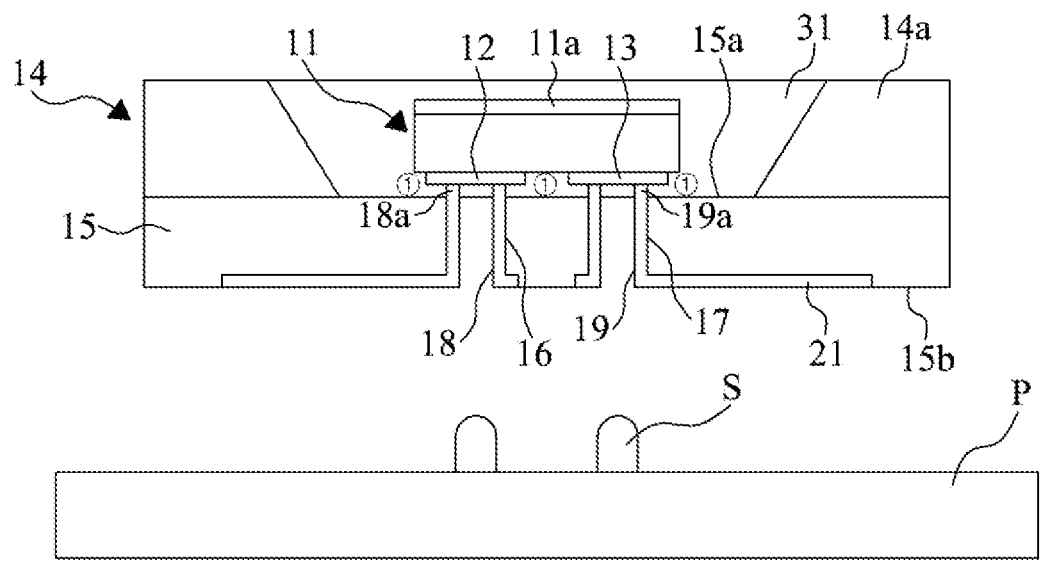
FIGS. 16 and 17 illustrate another exemplary embodiment of a semiconductor light emitting device according to the present disclosure.
Figure 16B:
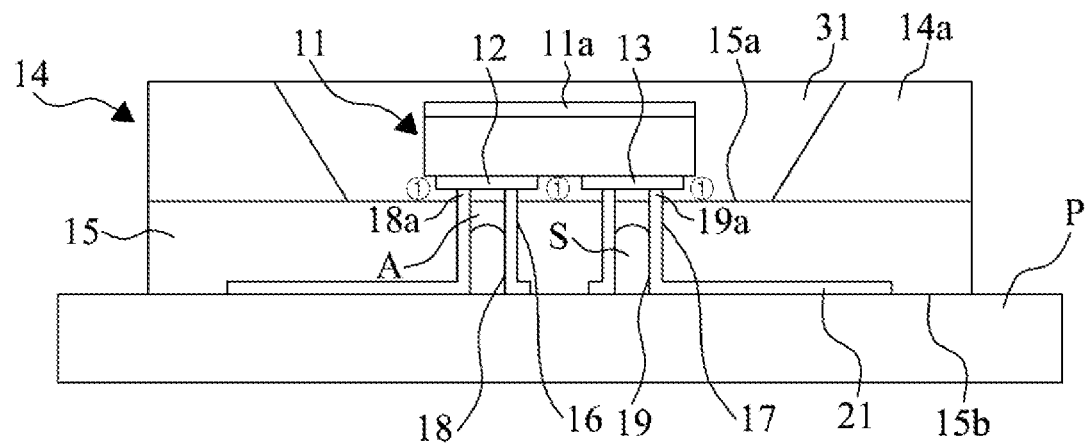
Figure 17:
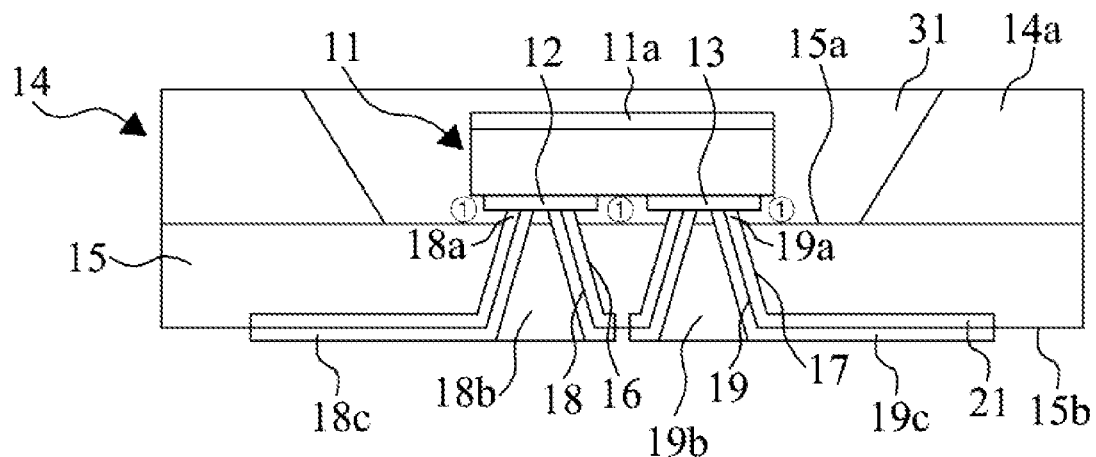

FIGS. 16 and 17 illustrate another exemplary embodiment of a semiconductor light emitting device according to the present disclosure. FIG. 16 shows some problems that may occur as the semiconductor light emitting device of FIG. 4 is coupled to a power supply board P (e.g., a PCB or sub-mount). As discussed previously, the semiconductor light emitting device of FIG. 4 has the through holes 16 and 17 which are not filled with the conductive parts 18 and 19, while the semiconductor light emitting device of FIG. 6 has the through holes 16 and 17 which are filled with the conductive parts 18 and 19. As shown in FIG. 16A, the through holes 16 and 17 are blocked by the semiconductor light emitting chip 11 on the upper side 15a of the bottom portion 15. If a solder S is used for coupling, an air gap A may be created as the solder S is introduced into the through holes 16 and 17 along the conductive parts 18 and 19, as shown in FIG. 16B. The air gap A not only interferes with proceeding of the solder S towards the top of the through holes 16 and 17, but its irregular shape also interferes with stable electrical coupling of the semiconductor light emitting device to the power supply board P. To resolve these issues, according to the present disclosure, the through holes 16 and 17 are provided with the conductive parts 18 and 19, as well as air gap-preventing materials 18b and 19b. The type of the air gap-preventing materials 18b and 19b is not particularly limited, provided that the materials can successfully suppress the formation of an air gap. For instance, they can be a conductive material such as an Ag- and/or Cu-based paste discussed in FIG. 6. Preferably, though, they can be a non-conductive material that is not blended with the solder S (e.g., white silicone or a liquid polymer resin), to minimize the intrusion the solder S into the through holes 16 and 17. Therefore, it is preferable to fill the through holes 16 and 17 with the air gap-preventing materials 18b and 19b all the way down to the bottom ends (the lower side 15b of the bottom portion 15). Alternatively, it is also possible that the through holes 16 and 17 are partly filled. The air gap-preventing materials 18b and 19b may be provided to the through holes 16 and 17 before or after the semiconductor light emitting chip 11 is coupled with the conductive parts 18 and 19. If needed, i.e., if the conductive parts 18 and 18 are not too thick (e.g., 5 μm or less), reinforcing conductors 18c and 19c (e.g., Cu, Ag, Au, Ni, or Pd) may be additionally provided by PVD such as sputtering or e-beam evaporation. Although it is possible to form the reinforcing conductors 18c and 19c by plating, PVD is preferred because it provides better electrical and thermal conductivities than the plating and because it allows the formation of the reinforcing conductors 18c and 19c only on the lower side 15b of the bottom portion 15. Preferably, the through holes 16 and 17 may have a gradually increasing width from the upper side 15a to lower side 15b of the bottom portion 15 (which can be achieved during injection molding of the through holes 16 and 17 in the mold, or by irradiating a laser beam for LDS onto the lower side 15b of the bottom portion 15). In this manner, the reinforcing conductors 18c and 19c as well as the air gap-preventing materials 18b and 19b can be stably accommodated in the through holes 16 and 17. The air gap-preventing materials 18b and 19b can be prepared by screen printing using a stencil shadow mask, or by dispensing using a nozzle for precise dispensing. If the through holes 16 and 17 are via-filled with a solder S containing an acid flux (that is, the major component of the flux is an acid) and subsequently subjected to a reflow process for heat treatment, gases are produced, and irregular air gaps are created by the gases. In contrast, according to the present disclosure, the through holes 16 and 17 are via-filled with white silicone, a liquid polymer resin, and a conductive material such as an Ag- and/or Cu-based paste, and the solder S is then subjected to a reflow process. Thus, it is practically impossible for gases produced by the solder S to enter into the through holes 16 and 17 and create irregular air gaps. Again, the air gap-preventing materials 18b and 19b may be prepared before or after the semiconductor light emitting chip 11 is coupled with the conductive parts 18 and 19. When the air gap-preventing materials 18b and 19b are prepared before the semiconductor light emitting chip 11 is coupled with the conductive parts 18 and 19, it is preferable that the through holes 16 and 17 are blocked in advance with a shadow mask or a protective layer from the side of the cavity prior to the preparation of the air gap-preventing materials 18b and 19b.

Set out below are a series of clauses that disclose features of further exemplary embodiments of the present disclosure, which may be claimed.

(1) A semiconductor light emitting device, comprising: a semiconductor light emitting chip having electrodes; a mold, which has a first surface roughness and includes a bottom portion where the semiconductor light emitting chip is arranged and through holes formed in the bottom portion, with the through holes being comprised of a surface having a second surface roughness different from the first surface roughness, wherein at least one side of the mold facing the semiconductor light emitting chip is made of a material capable of reflecting at least 95% of light emitted by the semiconductor light emitting chip; and conductive parts provided in the through holes for electrical communication with the electrodes.

(2) There is also provided, the semiconductor light emitting device of clause (1) wherein: a metal is exposed on the surface of the through holes to serve as a seed for forming the conductive parts (3) There is also provided, the semiconductor light emitting device of clause (2) further comprising: a heat dissipation metal layer, which is formed on a lower side of the bottom portion and has a pattern corresponding to a design pattern on the lower side of the bottom portion, wherein the lower side of the bottom portion has a third surface roughness higher than the first surface roughness.

(4) There is also provided, the semiconductor light emitting device of clause (3) wherein: the heat dissipation metal layer is connected with the conductive parts.

(5) There is also provided, the semiconductor light emitting device of clause (3) further comprising: upper metal layers, which are formed on the upper side of the bottom portion, sticking out of the through holes, and electrically bonded with the electrodes and conductive parts.

(6) There is also provided, the semiconductor light emitting device of clause (1) wherein: the conductive parts are formed by electroless plating, and the mold contains at least one LDS additive that is activated by a laser beam and serves as a seed for the electroless plating.

(7) There is also provided, the semiconductor light emitting device of clause (1) wherein: the conductive parts are formed by electroless plating, and the mold contains a first additive that is activated by a laser beam and serves as a seed for the electroless plating and a second additive that is activated by a laser beam and serves as a seed for the electroless plating, with the second additive having better heat dissipation performance than the first additive against heat generated from the semiconductor light emitting chip.

(8) There is also provided, the semiconductor light emitting device of clause (1) wherein: the conductive parts are formed by electroless plating, and the mold contains a first additive that is activated by a laser beam and serves as a seed for the electroless plating and a third additive that has a higher reflectance than the first additive for light emitted by the semiconductor light emitting chip.

(9) There is also provided, the semiconductor light emitting device of clause (7) or (8) wherein: the first additive comprises at least one selected from the group consisting of: Pd-based heavy metal complexes and metal oxides, metal oxide-coated fillers, $CuO \cdot Cr_2O_3$ spinel, copper salts, copper hydroxyphosphate, copper phosphate, cuprous thiocyanate, spinel-based metal oxides, $CuO \cdot Cr_2O_3$, organometallic complexes, antimony (Sb) doped Sn oxide, and metal oxides containing Cu, Zn, Sn, Mg, Al, Au, Ag, Ni, Cr, Fe, V, Co, or Mn.

(10) There is also provided, the semiconductor light emitting device of clause (7) wherein: the second additive comprises at least one selected from the group consisting of: AlN, AlC, $Al_2O_3$, AlON, BN, $MgSiN_2$, $Si_3N_4$, SiC, graphite, graphene, carbon fiber, ZnO, CaO, or MgO.

(11) There is also provided, the semiconductor light emitting device of clause (8) wherein: the third additive comprises at least one selected from the group consisting of: $TiO_2$, ZnO, BaS, and $CaCO_3$.

(12) There is also provided, the semiconductor light emitting device of clause (1) wherein: the mold is activated by a laser beam and serves as a seed for forming the conductive parts, with the mold containing an additive that reflects light emitted by the semiconductor light emitting chip, in an amount of at least 50 wt. %.

(13) There is also provided, the semiconductor light emitting device of clause (12) wherein: the additive is $TiO_2$.

(14) There is also provided, the semiconductor light emitting device of clause (8) wherein: the first additive is contained in a greater amount in the lower region of the mold than that in the upper region of the mold.

(15) There is also provided, the semiconductor light emitting device of clause (6) wherein: the mold comprises a reflective layer on a side facing the semiconductor light emitting chip to reflect light emitted by the semiconductor light emitting chip.

(16) A method for manufacturing a semiconductor light emitting device including a semiconductor light emitting chip having electrodes, a mold which has a bottom portion where the semiconductor light emitting chip is arranged and through holes formed in the bottom portion, and conductive parts provided in the through holes for electrical communication with the electrodes, the method comprising: preparing a lead frame which has one or more molds and an anti-plating layer formed on a region exposed from the molds; forming conductive parts in each of the molds and electrically communicating the conductive parts with the electrodes of the semiconductor light emitting chip; and cutting out the lead frame to obtain individual semiconductor light emitting devices.

(17) There is also provided, the method for manufacturing a semiconductor light emitting device of clause (16) wherein: the through holes are formed during preparing the lead frame, and subsequently a laser beam is irradiated to the through holes to provide seeds for forming the conductive parts.

(18) There is also provided, the method for manufacturing a semiconductor light emitting device of clause (16) wherein: the through holes are formed by laser drilling.

(19) There is also provided, the method for manufacturing a semiconductor light emitting device of clause (16) wherein: the conductive parts are formed by electroless plating.

(20) A semiconductor light emitting device that contains a nanoscale (nano-dimensioned) metal or metal oxide particle material showing a low absorption and high transparency for visible light in lieu of a first, second, and/or third additive, and a method for manufacturing the semiconductor light emitting device.

(21) A semiconductor light emitting device, comprising: a semiconductor UV light emitting chip having electrodes; a bottom portion where the semiconductor light emitting chip is arranged, with the bottom portion being made of a ceramic material and including conductive parts for electrical communication with the electrodes; and a reflective wall defining a cavity to accommodate the semiconductor light emitting chip therein, with the reflective wall being made of a non-metal and including a slanted side that reflects UV light and a metal reflective layer formed on the slanted side.

(22) There is also provided, the semiconductor light emitting device of clause (21) wherein: the reflective wall comprises a blend of an LDS mold matrix resin and LDS additives.

(23) There is also provided, the semiconductor light emitting device of clause (21) wherein: the LDS additives includes a first additive as a primary component, and/or additionally, a second additive used for improving heat dissipation performance.

(24) There is also provided, the semiconductor light emitting device of clause (21) wherein: the reflective wall is comprised of a silicon semiconductor 100 having crystal planes.

(25) There is also provided, the semiconductor light emitting device of clause (21) wherein: the reflective wall and the bottom portion are coupled without a bonding layer in-between.

(26) There is also provided, the semiconductor light emitting device of clause (21) wherein: the reflective wall and the bottom portion are coupled with a metallic bonding layer.

(27) There is also provided, the semiconductor light emitting device of clause (21) further comprising: a window arranged on the reflective wall, wherein the reflective wall and the window are coupled by metallic bonding.

(28) A semiconductor light emitting device adapted to be coupled to a power supply board by a solder, comprising: a semiconductor light emitting chip having electrodes; a mold, which includes a bottom portion where the semiconductor light emitting chip is arranged and through holes having a surface roughness higher than that of an upper side of the bottom portion; hollow conductive parts provided in the through holes for electrical communication with the electrodes; and an air gap-preventing material provided in each of the through holes for preventing the creation of air gaps as the solder enters into the through holes along the conductive parts, wherein the upper side of the bottom portion is not covered by upper metallic layers 18a and 19a but exposed into a cavity.

(29) There is also provided, the semiconductor light emitting device of clause (28) wherein: the air gap-preventing material comprises a non-conductive material.

(30) There is also provided, the semiconductor light emitting device of clause (28) further comprising: a heat dissipation metal layer 21 formed on a lower side of the bottom portion, with the heat dissipation metal layer being connected to the conductive parts and coupled with the solder, wherein the lower side of the bottom portion has a surface roughness higher than that of the upper side of the bottom portion.

(31) There is also provided, the semiconductor light emitting device of clause (28) wherein: the through holes are wider on the lower side of the bottom portion than on the upper side of the bottom portion.

(32) There is also provided, the semiconductor light emitting device of clause (28) further comprising: reinforcing conductors between the conductive parts and the air gap-preventing material.

An exemplary embodiment of a semiconductor light emitting device according to the present disclosure is configured to prevent light leaks downwards of the mold and features more securely anchored conductive layers.

Another exemplary embodiment of a semiconductor light emitting device according to the present disclosure benefits from the LDS process applied to the reflective wall, and the application of a ceramic substrate having a low thermal expansion coefficient allows the conductive layers of the device to be stably anchored on the bottom portion.

Another exemplary embodiment of a semiconductor light emitting device according to the present disclosure is adapted to suppress the formation of air gaps caused by the solder inside the through holes during soldering.

What is claimed is:

1. A semiconductor light emitting device, comprising:
    a semiconductor light emitting chip having electrodes;
    a mold, which has a first surface roughness and includes a bottom portion where the semiconductor light emitting chip is arranged and through holes formed in the bottom portion, with the through holes being comprised of a surface having a second surface roughness different from the first surface roughness, wherein at least one side of the mold facing the semiconductor light emitting chip is made of a material capable of reflecting at least 95% of light emitted by the semiconductor light emitting chip; and
    conductive parts provided in the through holes for electrical communication with the electrodes,
    wherein a metal is exposed on the surface of the through holes to serve as a seed for forming the conductive parts,
    wherein the semiconductor light emitting device further comprises:
    a heat dissipation metal layer, which is formed on a lower side of the bottom portion and has a pattern corresponding to a design pattern on the lower side of the bottom portion, wherein the lower side of the bottom portion has a third surface roughness higher than the first surface roughness.

2. The semiconductor light emitting device of claim 1, wherein the heat dissipation metal layer is connected with the conductive parts.

3. The semiconductor light emitting device of claim 1, further comprising:
    upper metal layers, which are formed on the upper side of the bottom portion, sticking out of the through holes, and electrically bonded with the electrodes and conductive parts.

4. A semiconductor light emitting device comprising:
    a semiconductor light emitting chip having electrodes;
    a mold, which has a first surface roughness and includes a bottom portion where the semiconductor light emitting chip is arranged and through holes formed in the bottom portion, with the through holes being comprised of a surface having a second surface roughness different from the first surface roughness, wherein at least one side of the mold facing the semiconductor light emitting chip is made of a material capable of reflecting at least 95% of light emitted by the semiconductor light emitting chip; and
    conductive parts provided in the through holes for electrical communication with the electrodes,
    wherein the conductive parts are formed by electroless plating, and the mold contains at least one LDS additive that is activated by a laser beam and serves as a seed for the electroless plating.

5. The semiconductor light emitting device of claim 4, wherein the mold comprises a reflective layer on a side facing the semiconductor light emitting chip to reflect light emitted by the semiconductor light emitting chip.

6. A semiconductor light emitting device, comprising:
    a semiconductor light emitting chip having electrodes;
    a mold, which has a first surface roughness and includes a bottom portion where the semiconductor light emitting chip is arranged and through holes formed in the bottom portion, with the through holes being comprised of a surface having a second surface roughness different from the first surface roughness, wherein at least one side of the mold facing the semiconductor light emitting chip is made of a material capable of reflecting at least 95% of light emitted by the semiconductor light emitting chip; and conductive parts provided in the through holes for electrical communication with the electrodes, wherein the conductive parts are formed by electroless plating, and the mold contains a first additive that is activated by a laser beam and serves as a seed for the electroless plating and a second additive that is activated by a laser beam and serves as a seed for the electroless plating, with the second additive having better heat dissipation performance than the first additive against heat generated from the semiconductor light emitting chip.

7. The semiconductor light emitting device of claim 6, wherein the first additive comprises at least one selected from the group consisting of: Pd-based heavy metal complexes and metal oxides, metal oxide-coated fillers, $CuO \cdot Cr_2O_3$ spinel, copper salts, copper hydroxyphosphate, copper phosphate, cuprous thiocyanate, spinel-based metal oxides, $CuO \cdot Cr_2O_3$, organometallic complexes, antimony (Sb) doped Sn oxide, and metal oxides containing Cu, Zn, Sn, Mg, Al, Au, Ag, Ni, Cr, Fe, V, Co, or Mn.

8. The semiconductor light emitting device of claim 6, wherein the second additive comprises at least one selected from the group consisting of: AlN, AlC, $Al_2O_3$, AlON, BN, $MgSiN_2$, $Si_3N_4$, SiC, graphite, graphene, carbon fiber, ZnO, CaO, or MgO.

9. A semiconductor light emitting device comprising a semiconductor light emitting chip having electrodes;

a mold, which has a first surface roughness and includes a bottom portion where the semiconductor light emitting chip is arranged and through holes formed in the bottom portion, with the through holes being comprised of a surface having a second surface roughness different from the first surface roughness, wherein at least one side of the mold facing the semiconductor light emitting chip is made of a material capable of reflecting at least 95% of light emitted by the semiconductor light emitting chip; and conductive parts provided in the through holes for electrical communication with the electrodes, wherein the conductive parts are formed by electroless plating, and the mold contains a first additive that is activated by a laser beam and serves as a seed for the electroless plating and a third additive that has a higher reflectance than the first additive for light emitted by the semiconductor light emitting chip.

10. The semiconductor light emitting device of claim 9, wherein the third additive comprises at least one selected from the group consisting of: $TiO_2$, ZnO, BaS, and $CaCO_3$.

11. The semiconductor light emitting device of claim 9, wherein the first additive is contained in a greater amount in the lower region of the mold than that in the upper region of the mold.

12. The semiconductor light emitting device of claim 9, wherein the first additive comprises at least one selected from the group consisting of: Pd-based heavy metal complexes and metal oxides, metal oxide-coated fillers, $CuO \cdot Cr_2O_3$ spinel, copper salts, copper hydroxyphosphate, copper phosphate, cuprous thiocyanate, spinel-based metal oxides, $CuO \cdot Cr_2O_3$, organometallic complexes, antimony (Sb) doped Sn oxide, and metal oxides containing Cu, Zn, Sn, Mg, Al, Au, Ag, Ni, Cr, Fe, V, Co, or Mn.

13. A semiconductor light emitting device, comprising:

a semiconductor light emitting chip having electrodes;

a mold, which has a first surface roughness and includes a bottom portion where the semiconductor light emitting chip is arranged and through holes formed in the bottom portion, with the through holes being comprised of a surface having a second surface roughness different from the first surface roughness, wherein at least one side of the mold facing the semiconductor light emitting chip is made of a material capable of reflecting at least 95% of light emitted by the semiconductor light emitting chip; and conductive parts provided in the through holes for electrical communication with the electrodes, wherein the mold is activated by a laser beam and serves as a seed for forming the conductive parts, with the mold containing an additive that reflects light emitted by the semiconductor light emitting chip, in an amount of at least 50 wt. %.

14. The semiconductor light emitting device of claim 13, wherein the additive is $TiO_2$.

* * * * *